US010101426B2

(12) United States Patent
Ooshima et al.

(10) Patent No.: US 10,101,426 B2
(45) Date of Patent: Oct. 16, 2018

(54) GENERATION AND DISPLAY OF PLURAL MR IMAGES HAVING DIFFERENT CROSS-SECTIONAL DIRECTIONS WITH FIXED COMMON OBSERVATION DIRECTION

(71) Applicant: TOSHIBA MEDICAL SYSTEMS CORPORATION, Otawara-Shi, Tochigi-Ken (JP)

(72) Inventors: Kiyomi Ooshima, Tochigi (JP); Satoshi Wakai, Tochigi (JP); Sachiko Nagasaka, Tokyo (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 540 days.

(21) Appl. No.: 14/730,721

(22) Filed: Jun. 4, 2015

(65) Prior Publication Data
US 2015/0355300 A1 Dec. 10, 2015

(30) Foreign Application Priority Data
Jun. 4, 2014 (JP) .................................. 2014-115465

(51) Int. Cl.
*G01V 3/00* (2006.01)
*G01R 33/56* (2006.01)
(Continued)

(52) U.S. Cl.
CPC ....... *G01R 33/5608* (2013.01); *G01R 33/543* (2013.01); *G01R 33/4826* (2013.01); *G01R 33/4835* (2013.01)

(58) Field of Classification Search
CPC .............. G01R 33/543; G01R 33/4835; G01R 33/546; G01R 33/5611; G01R 33/5635;
(Continued)

(56) References Cited

U.S. PATENT DOCUMENTS 7,164,268 B2 * 1/2007 Mugler, III ........ G01R 33/5615
324/307
7,174,200 B2 * 2/2007 Salerno .............. G01R 33/5601
424/9.3
(Continued)

FOREIGN PATENT DOCUMENTS

| JP | 2004-141269 | 5/2004 |
| JP | 2005-160503 | 6/2005 |
| JP | 2011-183069 | 9/2011 |

*Primary Examiner* — Vinh Nguyen
(74) *Attorney, Agent, or Firm* — Nixon & Vanderhye P.C.

(57) ABSTRACT

In one embodiment, a magnetic resonance imaging apparatus includes a magnetic resonance imaging apparatus includes: a gantry including at least an RF (Radio Frequency) coil and a gradient coil, wherein the RF coil receives MR (Magnetic Resonance) signals from an object when an RF signal from the RF coil and a gradient magnetic field from the gradient coil are applied to the object in a main scan; processing circuitry configured to reconstruct image data of a plurality of images of the object based on the MR signals, and generate display image data from the reconstructed image data, wherein the display image data is generated such that display images are observed from a unified observational direction, regardless of a case where cross-sectional directions vary; and a display configured to display the display images observed from the unified observational direction based on the display image data.

10 Claims, 16 Drawing Sheets

(51) Int. Cl.
*G01R 33/54* (2006.01)
*G01R 33/48* (2006.01)
*G01R 33/483* (2006.01)

(58) Field of Classification Search
CPC ............ G01R 33/5608; G01R 33/5659; G01R 33/5616; G01R 33/56383; G01R 33/246; G01R 33/54; G01R 33/4833; G01R 33/56509; G01R 33/3415; G01R 33/4826; G01R 33/56375; G01R 33/56518; G01R 33/56; G01R 33/5673; G01R 33/385; G01R 33/4822; G01R 33/5612; G01R 33/56545; G01R 33/5676; G01R 33/3628; G01R 33/3678; G01R 33/483; G01R 33/485; G01R 33/50; G01R 33/5617; G01R 33/56341; G01R 33/565; G01R 33/56536; G01R 33/24; G01R 33/288; G01R 33/34046; G01R 33/3607; G01R 33/3664; G01R 33/443; G01R 33/04; A61B 5/055; A61B 5/0037; A61B 2576/026; A61B 5/0044; A61B 5/0042; A61B 5/7257; A61B 5/0456; A61B 5/0555; A61B 5/7285; A61B 8/13; A61B 2034/2065; A61B 2090/0436; A61B 2090/0445; A61B 2090/00; A61B 2576/023; A61B 5/0033; A61B 5/0035; A61B 5/0263; A61B 5/201; A61B 5/4064; A61B 5/4514; A61B 5/4528; A61B 5/4561; A61B 5/4872; A61B 5/7207; A61B 5/7235; A61B 5/7264; A61B 5/7271; A61B 6/03; A61B 6/032; A61B 8/483; A61B 90/37

See application file for complete search history.

(56) References Cited

U.S. PATENT DOCUMENTS

| | | | |
|---|---|---|---|
| 7,218,107 B2 * | 5/2007 | Fuderer | G01R 33/565 324/309 |
| 8,731,270 B2 * | 5/2014 | Goto | G01R 33/56509 382/131 |
| 2007/0208248 A1 | 9/2007 | Harvey et al. | |

* cited by examiner

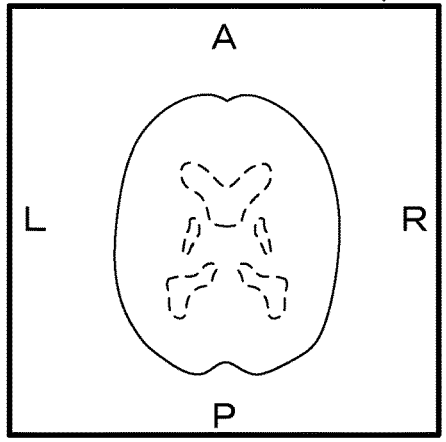
FIG. 5A  AXIAL CROSS-SECTIONAL IMAGE (AXIAL TYPE DISPLAY)
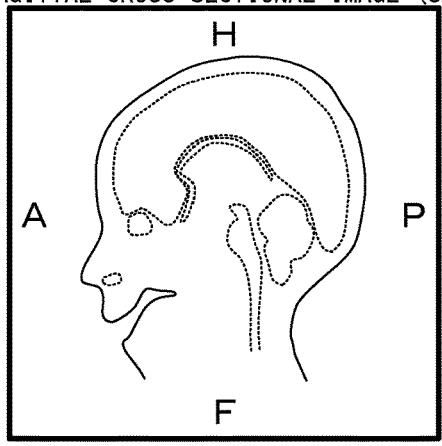
FIG. 5B  SAGITTAL CROSS-SECTIONAL IMAGE (SAGITTAL TYPE DISPLAY)
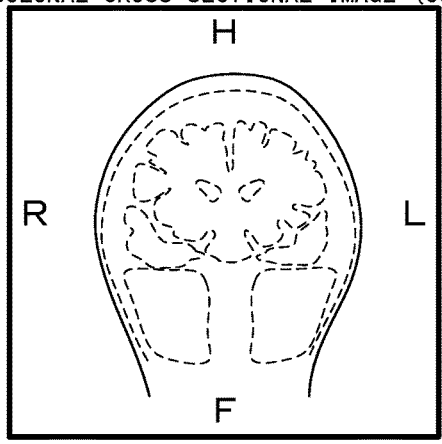
FIG. 5C  COLONAL CROSS-SECTIONAL IMAGE (CORONAL TYPE DISPLAY)

PRIOR ART

AXIAL TYPE DISPLAY

AXIAL TYPE DISPLAY

GENERATION AND DISPLAY OF PLURAL MR IMAGES HAVING DIFFERENT CROSS-SECTIONAL DIRECTIONS WITH FIXED COMMON OBSERVATION DIRECTION

CROSS-REFERENCE TO RELATED APPLICATION

This application is based upon and claims the benefit of priority from Japanese Patent Application No. 2014-115465 filed on Jun. 4, 2014, the entire contents of which are incorporated herein by reference.

FIELD

Embodiments described herein relate generally to an magnetic resonance imaging apparatus and its image display method.

BACKGROUND

MRI is an imaging method which magnetically excites nuclear spin of an object (a patient) placed in a static magnetic field with an RF pulse having the Larmor frequency and reconstructs an image based on MR signals generated due to the excitation. The above-mentioned MRI means magnetic resonance imaging, the RF pulse means a radio frequency pulse, and the MR signal means a magnetic resonance signal.

In an MRI apparatus, a three dimensional coordinate system composed of three coordinate axes which are orthogonal to each other around the apparatus is defined, in order to define a position and an angle while using the apparatus. This coordinate system is specific for each apparatus and is referred to as an apparatus coordinate system. However, because a patient as an object is imaged in various postures, a coordinate system on the basis of the posture and a direction of the patient is set independently of the apparatus coordinate system.

Then, in an MRI apparatus, a variable coordinate system is determined for each imaging on the basis of (a) the posture of the patient on a table such as a face-up position, a face-down position, a right lateral decubitus position, and a left lateral decubitus position and (b) the direction of inserting the patient into inside of the gantry such as from the head first and from the foot first. This coordinate system is determined on the basis of the posture of the patient at the time of imaging and is referred to as a patient coordinate system.

As an example in this specification, the X axis, the Y axis and the Z axis of the patient coordinate system are defined as follows. The right-to-left (horizontal) direction of the patient is defined as the X axis direction. In addition, the front-back direction of the patient is defined as the Y axis direction, assuming that the abdominal side is the front and the dorsal side is the back. In addition, topside-to-downside direction of the patient is defined as the Z axis direction, assuming that the head side is the topside and the foot side is the downside along the direction of a straight-line approximation of the backbone.

In addition, an X-Y plane of the patient coordinate system is called an axial plane, an X-Z plane of the patient coordinate system is called a coronal plane, and a Y-Z plane of the patient coordinate system is called a sagittal plane. In many cases, a patient is loaded on a table in such a manner that the horizontal moving direction of the table, which is the Z axis direction of the apparatus coordinate system, accords with the Z axis direction of the patient coordinate system.

In an MRI apparatus, orientation information displayed together with an image is determined on the basis of a cross-sectional direction of the patient coordinate system. When an axial cross-sectional image is displayed, for example, characters of "A", "P", "R", and "L" are displayed. Specifically, "A" is displayed near the middle of the upper side of the outer edge of the image, "P" is displayed near the middle of the lower side, "R" is displayed near the middle of the right side and "L" is displayed near the middle of the left side, for example. Here, "A" indicates anterior (the front side of the patient), "P" indicates posterior (the back side of the patient), "R" indicates right (the right side of the patient), and "L" indicates left (the left side of the patient).

In addition, when a sagittal cross-sectional image is displayed, each character is displayed like "H" near the middle of the upper side of the outer edge of the image, "F" near the middle of the lower side, "P" near the middle of the right side, and "A" near the middle of the left side, for example. Here, "H" indicates the head (the head side of the patient) and "F" indicates the foot (the foot side of the patient). In addition, when a coronal cross-sectional image is displayed, each character is displayed like "H" near the middle of the upper side of the outer edge of the image, "F" near the middle of the lower side, "L" (the left side of the patient himself/herself) near the middle of the right side, and "R" (the right side of the patient himself/herself) near the middle of the left side, for example.

Incidentally, as technology for precisely displaying orientation information of a patient associated with an image, Japanese Patent Application Laid-open (KOKAI) Publication No. 2011-183069 is known. In addition, the information indicating the orientation of the generated image such as the above "A", "P", etc. is stored as a part (accompanying information) of image data of the generated image, and is used when these image data are transferred from the MRI apparatus to another device.

Formerly, cases where cross-sections in parallel with each other are imaged are prevalent. However, in recent years, cases of imaging from various directions in accordance with an imaging part and a lesion area have been increasing. For example, there is a case of changing the cross-sectional direction of each image in a fan shape around a certain point as the center, or the like. In such multi-angle imaging, because the cross-sectional direction is different from one image to another, which of the axial cross-section, the coronal cross-section, and the sagittal cross-section is the closest to the imaging cross-section is determined for each image based on which posture the patient on the table of the MRI apparatus was inserted in. Then, the orientation information associated with an image is displayed in accordance with the closest cross-section out of the axial cross-section, the coronal cross-section and sagittal cross-section.

In other words, in conventional multi-angle imaging, though the orientation information of A, P, R, and L is additionally displayed as an axial cross-section up to an image of a certain cross-section, the display aspect from the next image suddenly switches into that of a sagittal cross-section or coronal cross-section in some cases, for example. In this case, because the display aspect of the entire image changes, it is difficult for a user having focused on the same region of interest between the respective images such as a cross-section of a spine etc. to continuously observe or visually recognize change of the patient between plural images.

Therefore, novel technology to visually recognize change of a patient between plural images of MRI more easily than conventional technology in the case of changing the cross-sectional direction between these images has been desired.

Similarly, novel technology to visually recognize change of a region of interest between plural images of MRI more easily than conventional technology in the case of changing arrangement of the region of interest between these images has been desired.

BRIEF DESCRIPTION OF THE DRAWINGS

FIG. 5A is an example of displaying an axial cross-sectional image of a patient;

FIG. 5B is an example of displaying an sagittal cross-sectional image of a patient;

FIG. 5C is an example of displaying an coronal cross-sectional image of a patient;

DETAILED DESCRIPTION

Hereinafter, examples of aspects which embodiments of the present invention can take will be explained per aspect.

(1) According to one embodiment, a magnetic resonance imaging apparatus includes: a gantry including at least an RF (Radio Frequency) coil and a gradient coil, wherein the RF coil receives MR (Magnetic Resonance) signals from an object when an RF signal from the RF coil and a gradient magnetic field from the gradient coil are applied to the object in a main scan; processing circuitry configured to reconstruct image data of a plurality of images of the object based on the MR signals, and generate display image data from the reconstructed image data, wherein the display image data is generated such that display images are observed from a unified observational direction, regardless of a case where cross-sectional directions vary; and a display configured to display the display images observed from the unified observational direction based on the display image data.

(2) According to another embodiment, an MRI apparatus includes a gantry including at least an RF (Radio Frequency) coil and a gradient coil, wherein the RF coil receives MR (Magnetic Resonance) signals from an object when an RF signal from the RF coil and a gradient magnetic field from the gradient coil are applied to the object in a main scan; an input circuit configured to receive an input which designate a specified tissue of the object to be tracked between a plurality of images of the object; processing circuitry configured to (a) reconstruct image data of the plurality of images of the object based on the MR signals, (b) extract a region of the specified tissue from each of the plurality of images, and (c) generate display image data, which make the region of the specified tissue of each of images be displayed at a unified position on a screen, from reconstructed image data; and a display configured to display images based on the display image data, so that the region of the specified tissue of each of the images is displayed at the unified position on the screen.

Hereinafter, an MRI apparatus and its image display method according to embodiments will be described with reference to the accompanying drawings. Note that the same reference numbers are given for identical components in each figure, and duplicated explanation is omitted.

The First Embodiment

Figure 1:
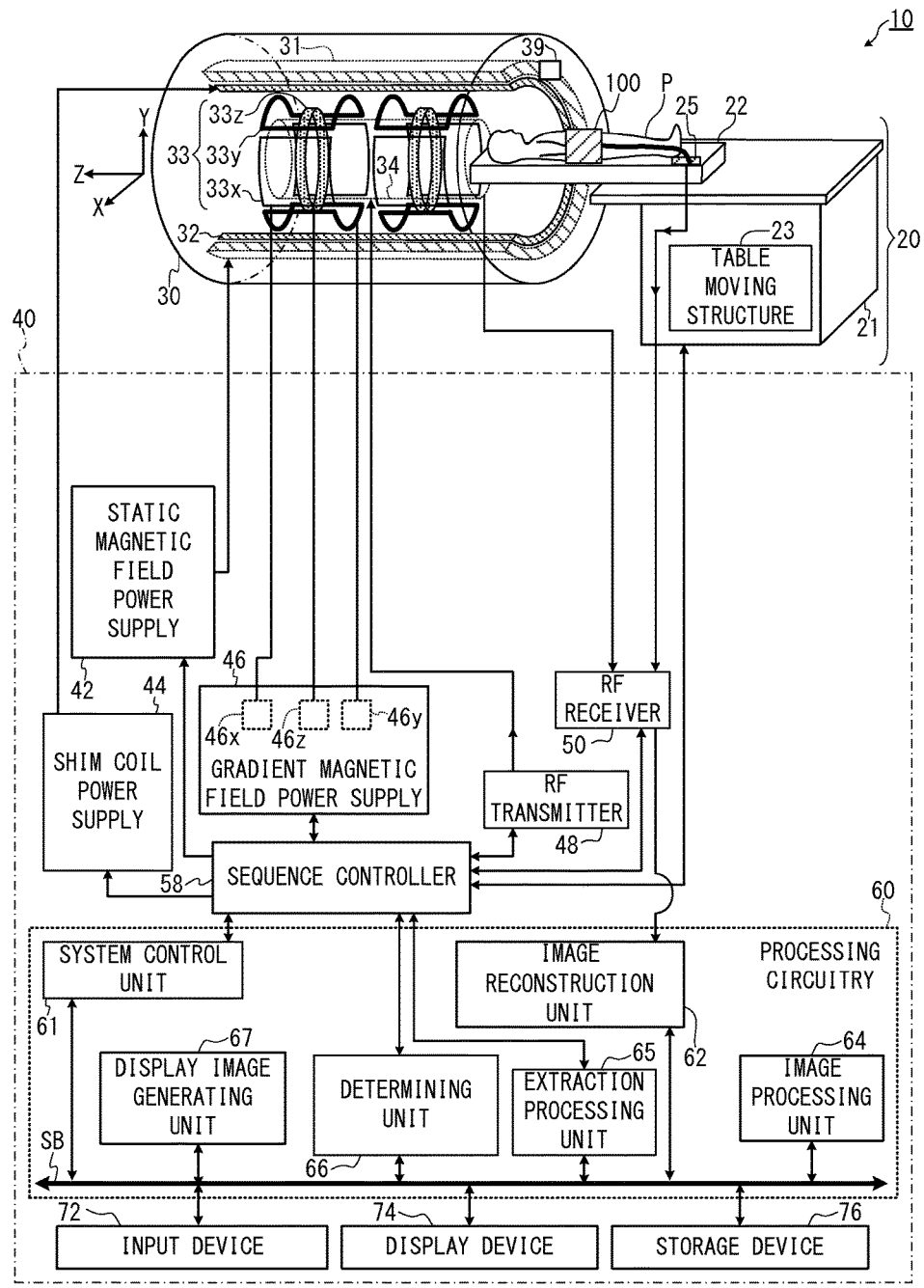
FIG. 1 is a block diagram showing an example of overall configuration of the MRI apparatus according to the first embodiment.

FIG. 1 is a block diagram showing an example of overall configuration of the MRI apparatus 10 according to the first embodiment. Incidentally, the hardware structure of the MRI apparatus 10 explained based on FIG. 1 is common to the first embodiment and the second embodiment. As an example here, the components of the MRI apparatus 10 will be explained by classifying them into three groups: a bed device 20, a gantry 30 and a control device 40.

The bed device 20 includes a supporting platform 21, a table 22, and a table moving structure 23 disposed inside the supporting platform 21. An object P is loaded on the top surface of the table 22. In addition, a plurality of connection ports 25 to which wearable type RF coil devices are connected are disposed on the top surface of the table 22.

The supporting platform 21 supports the table 22 in such a manner that the table 22 can move in the horizontal direction (i.e. the Z axis direction of the apparatus coordinate system).

The table moving structure 23 adjusts the position of the table 22 in the vertical direction by adjusting the height of the supporting platform 21, when the table 22 is located outside the gantry 30.

In addition, the table moving structure 23 inserts the table 22 into inside of the gantry 30 by moving the table 22 in the horizontal direction and moves the table 22 to outside of the gantry 30 after completion of imaging.

The gantry 30 is shaped in the form of a cylinder, for example, and is installed in an imaging room. The gantry 30 includes a static magnetic field magnet 31, a shim coil unit 32, a gradient magnetic field coil unit 33, an RF coil unit 34 and a projector 39.

The projector 39 is disposed at the opening section (entrance) of the gantry 30 and irradiates light for positioning toward the table 22.

The static magnetic field magnet 31 is, for example, a superconductivity coil and shaped in the form of a cylinder. The static magnetic field magnet 31 forms a static magnetic field in an imaging space by using electric currents supplied from the static magnetic field power supply 42 to be described below.

The above imaging space means, for example, a space in the gantry 30 in which the object P is placed and to which the static magnetic field is applied. Note that the static magnetic field magnet 31 may include a permanent magnet which makes the static magnetic field power supply 42 unnecessary.

The shim coil unit 32 is, for example, shaped in the form of a cylinder and arranged inside the static magnetic field magnet 31 so as to become coaxial with the static magnetic field magnet 31. The shim coil unit 32 forms an offset magnetic field that uniforms the static magnetic field by using electric currents supplied from the shim coil power supply 44 of the control device 40 to be described below.

The gradient magnetic field coil unit 33 is, for example, shaped in the form of a cylinder and arranged inside the shim coil unit 32. The gradient magnetic field coil unit 33 includes an X axis gradient magnetic field coil 33$x$, a Y axis gradient magnetic field coil 33$y$ and a Z axis gradient magnetic field coil 33$z$.

As an example here, the X axis, the Y axis and the Z axis of the apparatus coordinate system is defined as follows. First, the Y axis direction is defined as the vertical direction, and the table 22 is disposed in such a position that the direction of the normal line of its top surface accords with the Y axis direction. The horizontal moving direction of the table 22 is defined as the Z axis direction, and the gantry 30 is installed in such a manner that its axis direction accords with the Z axis direction. The X axis direction is the direction perpendicular to these Y axis direction and Z axis direction, and is the width direction of the table 22 in the example of FIG. 1.

As an example here, in order to simplify the explanation, it is assumed that the origin of the apparatus coordinate system accords with the magnetic center inside the gantry 30 of the MRI apparatus 10 and the origin of the apparatus coordinate system is the same as the origin of the patient coordinate system.

The X axis gradient magnetic field coil 33$x$ forms a gradient magnetic field Gx in the X axis direction in an imaging region in accordance with an electric current supplied from the X axis gradient magnetic field power supply 46$x$ to be described below. Similarly, the Y axis gradient magnetic field coil 33$y$ forms a gradient magnetic field Gy in the Y axis direction in the imaging region in accordance with an electric current supplied from the Y axis gradient magnetic field power supply 46$y$ to be described below. Similarly, the Z axis gradient magnetic field coil 33$z$ forms a gradient magnetic field Gz in the Z axis direction in the imaging region in accordance with an electric current supplied from the Z axis gradient magnetic field power supply 46$z$ to be described below.

Thereby, directions of a gradient magnetic field Gss in a slice selection direction, a gradient magnetic field Gpe in a phase encoding direction and a gradient magnetic field Gro in a readout (frequency encoding) direction can be arbitrarily selected as logical axes, by combining the gradient magnetic fields Gx, Gy and Gz in the X axis, the Y axis and the Z axis directions as three physical axes of the apparatus coordinate system.

The above imaging region means, for example, at least a part of an acquisition range of MR signals used to generate one image or one set of images, which becomes an image. The imaging region is three-dimensionally defined as a part of the imaging space by the apparatus coordinate system, for example. In addition, the above one set of images means, for example, a plurality of images when MR signals of the plurality of images are acquired in a lump in one pulse sequence such as multi-slice imaging. As an example here, an imaging region is referred to as a slice if it is a thin region in terms of thickness, and an imaging region is referred to as a slab if it has a certain degree of thickness.

The RF coil unit 34 is, for example, shaped in the form of a cylinder and arranged inside the gradient magnetic field coil unit 33. The RF coil unit 34 includes a non-illustrated whole body coil that combines a function of transmitting RF pulses and a function of detecting MR signals, for example.

Thirdly, the control device 40 includes the static magnetic field power supply 42, the shim coli power supply 44, a gradient magnetic field power supply 46, an RF transmitter 48, an RF receiver 50, a sequence controller 58, processing circuitry 60, an input device 72, a display device 74 and the storage device 76.

The gradient magnetic field power supply 46 includes the X axis gradient magnetic field power supply 46$x$, the Y axis gradient magnetic field power supply 46$y$ and the Z axis gradient magnetic field power supply 46$z$.

The X axis gradient magnetic field power supply 46$x$, the Y axis gradient magnetic field power supply 46$y$ and the Z axis gradient magnetic field power supply 46$z$ supply the respective electric currents for forming the gradient magnetic field Gx, the gradient magnetic field Gy and the gradient magnetic field Gz to the X axis gradient magnetic field coil 33$x$, the Y axis gradient magnetic field coil 33$y$ and the Z axis gradient magnetic field coil 33$z$, respectively.

The RF transmitter 48 generates RF pulse electric currents of the Larmor frequency for causing nuclear magnetic resonance in accordance with control information inputted from the sequence controller 58, and transmits the generated RF pulse electric currents to the RF coil unit 34. The RF pulses in accordance with these RF pulse electric currents are transmitted from the RF coil unit 34 to the object P.

The whole body coil of the RF coil unit 34 and the RF coil device 100 loaded on the object P detect MR signals generated due to excited nuclear spin inside the object P by the RF pulses, and the detected MR signals are inputted to the RF receiver 50.

The RF receiver 50 generates raw data which are digitized complex number data of MR signals obtained by performing predetermined signal processing on the received MR signals and then performing A/D (analogue to digital) conversion on them. The RF receiver 50 sends the generated raw data of MR signals to the processing circuitry 60 to reconstruct the image.

The sequence controller 58 stores control information needed in order to make the gradient magnetic field power supply 46, the RF transmitter 48 and the RF receiver 50 drive in accordance with commands from the processing circuitry 60. The above-mentioned control information includes, for example, sequence information describing operation control information such as intensity, application period and application timing of the pulse electric currents which should be applied to the gradient magnetic field power supply 46. The sequence controller 58 generates the gradient magnetic fields Gx, Gy and Gz and RF pulses by driving the gradient magnetic field power supply 46, the RF transmitter 48 and the RF receiver 50 in accordance with a predetermined sequence stored.

The processing circuitry 60 includes one or more processers or a CPU (Central Processing Unit), and one or more memories such as a RAM (Random Access Memory) and a ROM (Read Only Memory).

The processing circuitry 60 also includes a system control unit 61, an image reconstruction unit 62, an image processing unit 64, an extraction processing unit 65, a determining unit 66 and a display image generating unit 67. In other words, the processing circuitry 60 implements a system control function 61, an image reconstruction function 62, an image processing function 64, an extraction processing function 65, a function 66 and a display image generating function by executing one or more program(s) stored in the one or more memories.

The system control unit 61 performs overall system control of the MRI apparatus 10 such as setting of imaging conditions of a main scan, an imaging operation and image display after imaging.

The above imaging condition refers to under what condition RF pulses or the like are transmitted in what type of pulse sequence, or under what condition MR signals are acquired from the object P, for example. As parameters of the imaging conditions, for example, there are an imaging region as positional information in the imaging space, a flip angle, a repetition time (TR), the number of slices, an imaging part, the type of the pulse sequence such as spin echo and parallel imaging, etc. The above imaging part means a region of the object P to be imaged, such as a head, a chest, an abdomen, and so on.

The above main scan is a scan for imaging an intended diagnosis image such as a T1 weighted image, and it does not include a scan for acquiring MR signals for a scout image or a calibration scan. A scan is an operation of acquiring MR signals, and it does not include image reconstruction processing.

The calibration scan is a scan for determining unconfirmed elements of imaging conditions, conditions and data used for image reconstruction processing and correction processing after the image reconstruction, and the calibration is performed separately from the main scan. As an example of the calibration scan, there is a sequence of obtaining the center frequency of the RF pulses of the main scan or the like.

In addition, the system control unit 61 makes the display device 74 display screen information for setting imaging conditions, sets the imaging conditions on the basis of command information from the input device 72, and inputs the determined imaging conditions to the sequence controller 58. In addition, the system control unit 61 makes the display device 74 display images indicated by the generated display image data after completion of imaging.

The input device 72 includes equipment of input manipulation such as a mouse and a key board, and provides a user with a function to set the imaging conditions and image processing conditions.

The determining unit 66 determines the most common, i.e., most frequent cross-sectional direction, after the respective cross-sectional directions of a plurality of images are determined as the imaging conditions of the main scan.

Here, one of the features of the present embodiment lies in that a plurality of images are displayed in a unified manner under the same observational reference without switching orientation information which is additionally displayed/superimposed on each image, even in the case that cross-sectional directions between plural images are changed. In order to achieve this, the input device 72 receives an input which designates an observational direction (observation orientation) unified between plural images, before execution of the main scan. As an example here, the input device 72 receives an input which designates the observational direction, while displaying the most common cross-sectional direction determined by the determining unit 66 on the display device 74.

The image reconstruction unit 62 arranges and stores the raw data of MR signals inputted from the RF receiver 50 as k-space data, in accordance with the phase encode step number and the frequency encode step number. The above k-space means a frequency space. The image reconstruction unit 62 generates image data of the object P by performing image reconstruction processing including such as two-dimensional or three-dimensional Fourier transformation and so on. The image reconstruction unit 62 stores the generated image data in the storage device 76.

The image processing unit 64 takes in the image data from the storage device 76, performs predetermined image processing on them, and stores the image data subjected to the image processing in the storage device 76.

The display image generating unit 67 acquires image data of a plurality of images subjected to the image processing, from the storage device 76. Then, the display image generating unit 67 generates such display image data that these images are displayed as images observed from a unified observational direction, even if a cross-sectional direction of each image corresponding to the image data of these images changes between them. Details of the operation of the display image generating unit 67 will be described below. The generated display image data are temporarily stored in the storage device 76.

The storage device 76 stores the imaging conditions used for generating the display image data, information on the object P, the orientation information of each image, etc. as accompanying information in addition to the above display image data.

The extraction processing unit 65 executes extraction processing in which specific tissue regions of an object such as the spine, the kidney, etc. are extracted, on the basis of the image data of a plurality of images. Details of the operation of the extraction processing unit 65 will be explained in the second embodiment.

The display device 74 displays images observed from a unified observational direction, on the basis of the above display image data generated by the display image generating unit 67.

Note that the four units i.e., the processing circuitry 60, the input device 72, the display device 74, and the storage device may be configured as one computer and disposed in a computer room, for example.

In addition, although the components of the MRI apparatus 10 are classified into three groups (i.e., the gantry 30, the bed device 20 and the control device 40) in the above explanation, this is only an example of a configuration. For example, the table moving structure 23 may be configured as a part of the control device 40.

Alternatively, the RF receiver 50 may be included not outside the gantry 30 but inside the gantry 30. In this case, for example, an electronic circuit board that is equivalent to the RF receiver 50 may be disposed in the gantry 30. Then, the MR signals, which are analog electrical signals converted from the electromagnetic waves by the RF coil device and so on, may be amplified by a pre-amplifier in the electronic circuit board, then the amplified signals may be outputted to the outside of the gantry 30 as digital signals and inputted to the image reconstruction unit 62. In outputting the signals to the outside of the gantry 30, for example, an optical communication cable is preferably used to transmit the signals in the form of optical digital signals. This is because the effect of external noise is reduced.

Figure 2:
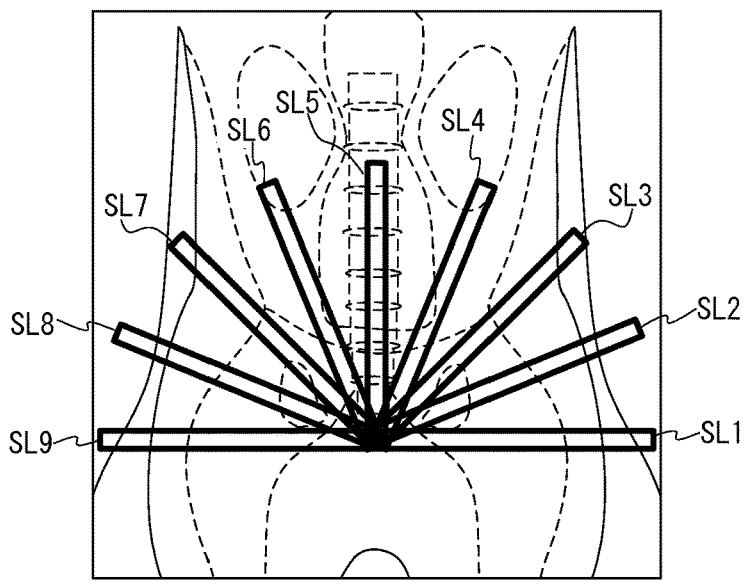
FIG. 2 is a schematic diagram of a scout image of a coronal cross-section of the patient coordinate system, showing an example of a setting method of imaging regions of the main scan.

FIG. 2 is a schematic diagram of a scout image of a coronal cross-section of the patient coordinate system, showing an example of a setting method of imaging regions of the main scan. As shown in FIG. 2, a user can set the position of each slice so as to be radially arranged like the slices SL1 to SL9, for example, via the input device 72, while watching the coronal cross-sectional image displayed on the display device 74.

Figure 3:
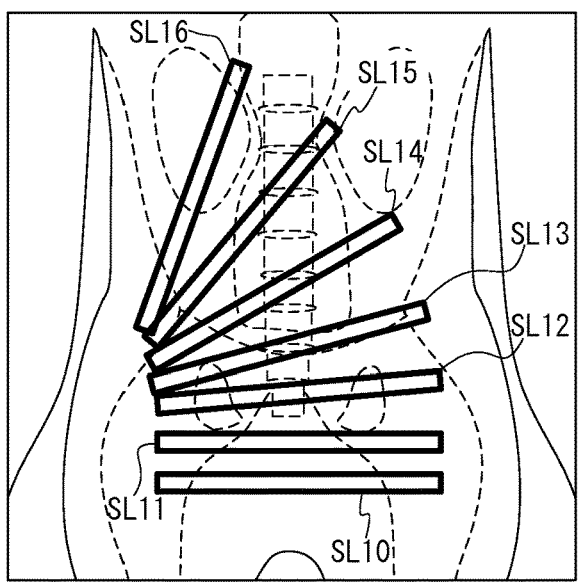
FIG. 3 is a schematic diagram of a scout image of a coronal cross-section of the patient coordinate system, showing another example of a setting method of imaging regions of the main scan.

FIG. 3 is a schematic diagram of a scout image of a coronal cross-section of the patient coordinate system, showing another example of a setting method of imaging regions of the main scan. As shown in FIG. 3, a user can set the respective positions of the slices SL10 to SL16, for example, so as to gradually approach a sagittal cross-section from an axial cross-section via the input device 72 in the way similar to the above.

Figure 4:
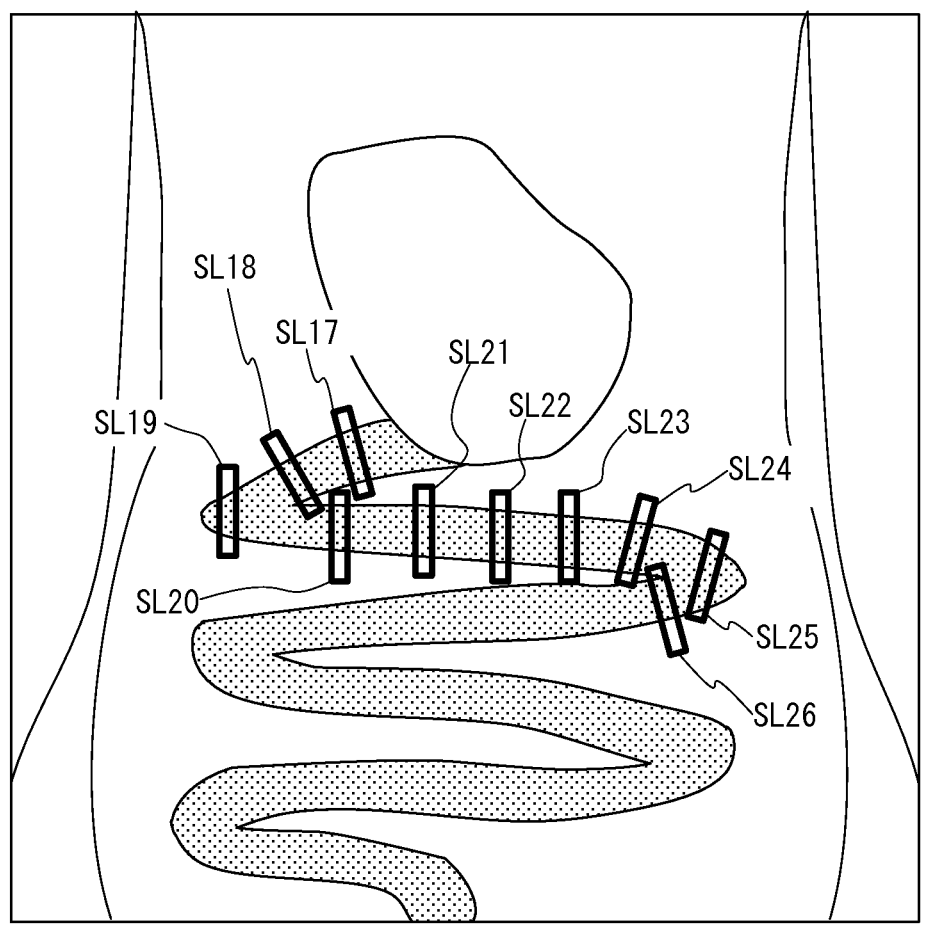
FIG. 4 is a schematic diagram of a scout image of a coronal cross-section of the patient coordinate system, showing still another example of a setting method of imaging regions of the main scan.

FIG. 4 is a schematic diagram of a scout image of a coronal cross-section of the patient coordinate system, showing still another example of a setting method of imaging regions of the main scan. If a tissue of a region of interest is a sinuous region such as an intestine or the like, a user can set each of the slices SL17 to SL26 to an intended cross-sectional direction in accordance with the shape of this tissue so that each slice becomes the orthogonal cross-section of this tissue, for example.

FIG. 5A to FIG. 5C are diagrams showing the conventional method of displaying cross-sectional images. FIG. 5A is an example of displaying an axial cross-sectional image. An axial cross-sectional image is generally displayed so that the anterior side of the patient becomes the upper side of the image and the posterior side of the patient becomes the lower side of the image. Meanwhile, there are two types of axial cross-sectional image display as to the right and left sides. In one type of axial cross-sectional image display, the left side of the patient is displayed on the left side of the image and the right side of the patient is displayed on the right side of the image. In the other type of axial cross-sectional image display, the left side of the patient is displayed on the right side of the image and the right side of the patient is displayed on the left side of the image. The correspondence relationship between the right/left of image display and the right/left of the patient is determined depending on view direction of the axial cross-section in the phase of imaging plan. In other words, it is determined depending on whether the axial cross-section of the patient is viewed from the head side or from the foot side. Such a display manner that the anterior side (A), the posterior side (P), the left side (L)/right side (R), and the right side (R)/left side (L) of the patient respectively correspond to the upper side, the lower side, the left side and the right side of the image is hereinafter referred to as "the axial type display" or "the axial plane display".

Although there are two types of the axial type display or the axial plane display as mentioned above, hereafter, only one type as shown in FIG. 5A will be explain below, which corresponds to the type in which the anterior side (A), the posterior side (P), the left side (L), and the right side (R) of the patient respectively correspond to the upper side, the lower side, the left side, and the right side of the image.

FIG. 5B is an example of displaying a sagittal cross-sectional image. A sagittal cross-sectional image is generally displayed in such a manner that the head side of the patient becomes the upper side of the image, the foot side of the patient becomes the lower side of the image, the anterior side of the patient becomes the left side of the image, and the posterior side of the patient becomes the right side of the image. Such a display manner that the head side (H), the foot side (F), the anterior side (A) and the posterior side (P) of the patient respectively correspond to the upper side, the lower side, the left side, and the right side of the image is hereinafter referred to as "the sagittal type display" or "the sagittal plane display".

Similarly, FIG. 5C is an example of displaying a coronal cross-sectional image. A coronal cross-sectional image is generally displayed in such a manner that the head side of the patient becomes the upper side of the image, the foot side of the patient becomes the lower side of the image, the right side of the patient becomes the left side of the image, and the left side of the patient becomes the right side of the image. Such a display manner that the head side (H), the foot side (F), the right side (R) and the left side (L) of the patient respectively correspond to the upper side, the lower side, the left side, and the right side of the image is hereinafter referred to as "the coronal type display" or "the coronal plane display".

Next, how the cross-sectional images corresponding to the respective angles change in the case of multi-angle imaging will be explained by using a human body model.

Figures 6A, 6B:
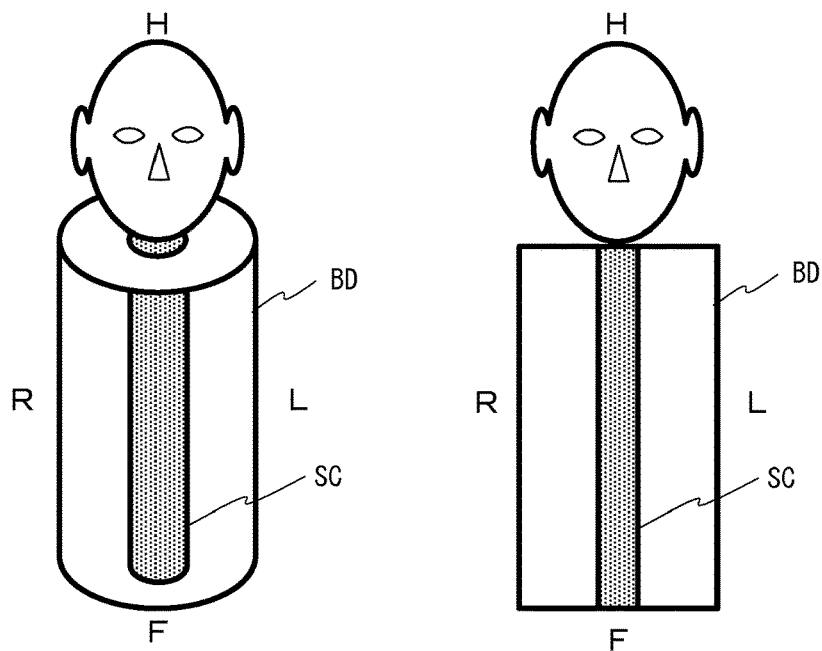
FIG. 6A to FIG. 6C are diagrams showing an example of setting the positions of the respective slices of multi-angle imaging by using a scout image in which a human body is simulated by a column.

FIG. 6A shows a human body model simulating the trunk BD of a patient and the spinal column SC of the patient by columns respectively. It is assumed that the respective center axes of the trunk BD and the spinal column SC are arranged at the same position. FIG. 6B is a diagram of this human model when viewed from the front and corresponds to a coronal cross-sectional image.

Figure 6C:
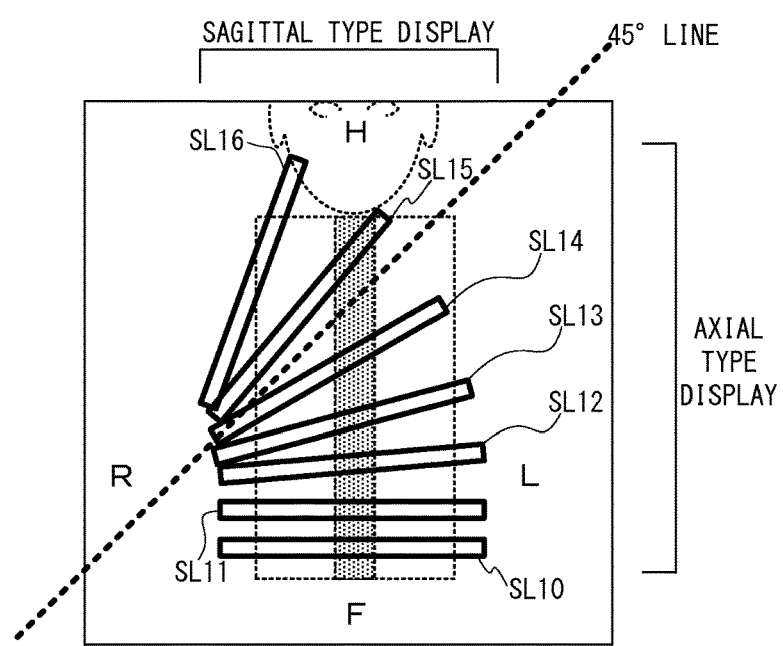

FIG. 6C shows that this coronal cross-section is displayed on the display device 74 as a scout image and the position of each imaging cross-section of multi-angle imaging is set as slices SL10 to SL16 via the input device 72.

When the position of each imaging cross-section of multi-angle imaging is set in the above manner and the image of each imaging cross-section is displayed after imaging, the display method of imaging cross-sections is switched with the 45 degrees line shown in FIG. 6C as a boundary in the conventional technology. Specifically, the respective imaging cross-sections located below the 45 degrees line (i.e. the slices SL10 to SL14) are displayed under "the axial type display", and the respective imaging cross-sections located above the 45 degrees line (i.e. the slices SL15 and SL16) are displayed under "the sagittal type display".

FIG. 7A to FIG. 7D show how the images of the respective imaging cross-section of the above human model corresponding to the slices SL12 to SL15 change in the conventional display method. Because the images of the respective imaging cross-sections corresponding to the slices SL12, SL13 and SL14 are located below the 45 degrees line, these are displayed under "the axial type display" (see FIG. 7A, FIG. 7B and FIG. 7C). In other words, they are displayed so that the anterior side (A), the posterior side (P), the left side (L) and the right side (R) of the patient respectively correspond to the upper side, the lower side, the left side, and the right side of the image.

In addition, if an inclination angle from the real axial cross-section (a horizontal cross-section like the slice SL10 in FIG. 6C) becomes larger, the approximately circular cross-sectional shape of the trunk BD and the spinal column SC in the slice SL12 change to ellipse shape even in the case of the same axial type display. In addition, the larger this inclination angle becomes, the longer the major axis of the ellipse gradually becomes with respect to its minor axis.

In contrast, because the image of the imaging cross-section corresponding to the slice SL15 is located above the 45 degrees line (see FIG. 7D), it is displayed under "the sagittal type display". In other words, it is displayed so that the head side (H), the foot side (F), the anterior side (A) and the posterior side (P) of the patient respectively correspond to the upper side, the lower side, the left side and the right side of the image.

That is, in the conventional display method, each of the right-to-left direction, the front-back direction and the head-foot direction of a human body is different between the image corresponding to the slice SL15 and the images corresponding to the slices SL12 to SL14. Moreover, the ellipse indicating the shape of the trunk BD and the spinal column SC is displayed in a state wherein the directions of its major axis and minor axis are replaced with each other. In addition, the display positions and display contents of the accompanying information indicating the head side (H), the foot side (F), the anterior side (A), the posterior side (P), the left side (L) and the right side (R) of a patient change in association with the change from the axial type display to the sagittal type display.

In the above explanation, a human model in which the trunk and the spinal column are respectively simulated by columns is used for intuitive understanding of the changes of an image. However, similar change may occur in actually generated images of an actual patient between the respective images.

A diagnostic reading doctor etc. may often observe generated images obtained by multi-angle imaging, while sequentially switching images in accordance with an imaging order. However, when the displayed image is switched from the image of the slice SL14 to the image of the slice SL15 (see FIG. 7C and FIG. 7D), the relationship between (a) the display direction of an image and (b) the right-to-left direction, the front-back direction and the head-foot direction of a human body suddenly drastically changes in the conventional display method. This change causes the position and direction of the target region within the image to drastically change and thus continuous observation of plural images is very difficult for a reader in the conventional display method.

Figure 7A:
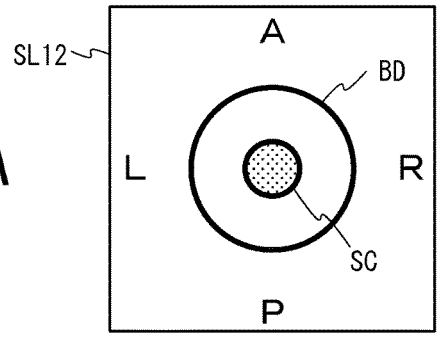
FIG. 7A to FIG. 7D are diagrams showing how images of respective imaging cross-sections of a human model corresponding to a plurality of slices change in the conventional display method.
Figure 7B:
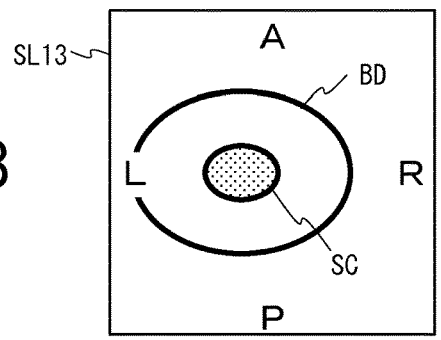
Figure 7C:
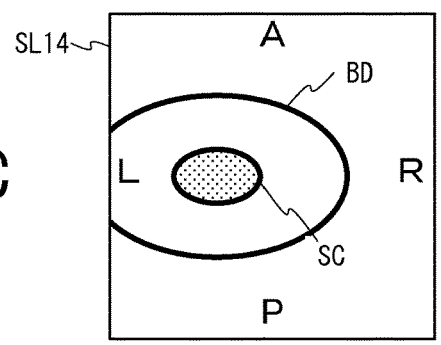
Figure 7D:
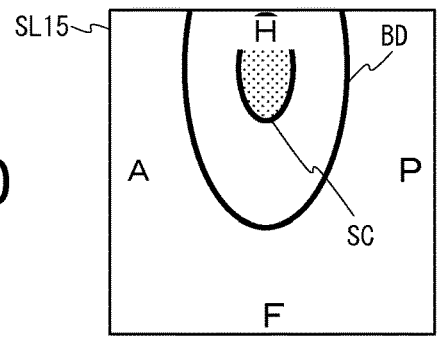

In addition, in the conventional display method, the relative position of the target region in a slice may change between respective images, even in the case of consistently using the same axial type display. For example, it is assumed that the target region is the spinal column SP of a patient when the position of each slice is set like FIG. 6C. In this case, even if the same axial type display is consistently used, the spinal column SP in the images respectively corresponding to the slices SL12, SL13 and SL14 is displayed so as to gradually shift toward the left side in terms of position as shown in FIG. 7A to FIG. 7C. Such shift of the target region is also a factor of making it difficult to observe images.

The MRI apparatus 10 of the first embodiment resolves such inconvenience in the conventional display method. In the following, the display method of the MRI apparatus 10 of the first embodiment will be explained in detail.

Figure 8:
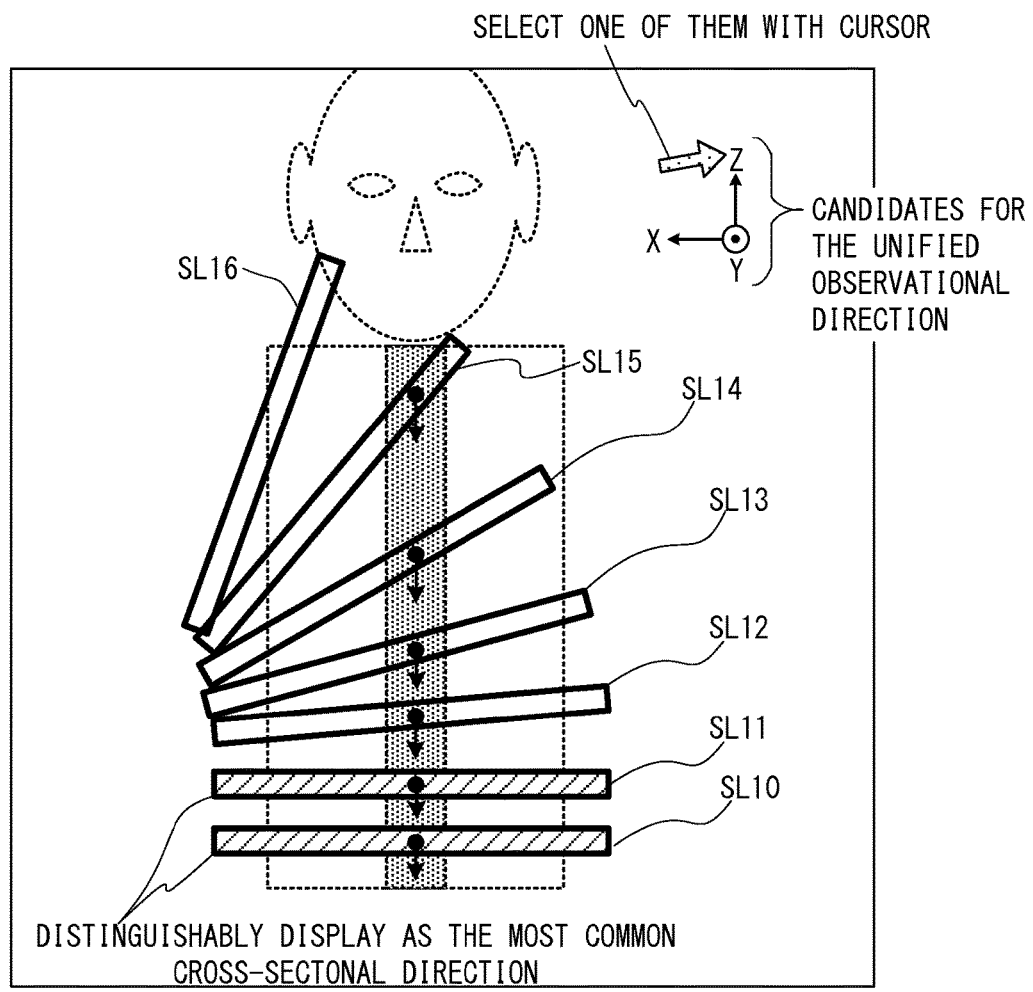
FIG. 8 is a diagram showing an example of a method of setting a unified observational direction in the first embodiment.
Figure 9A:
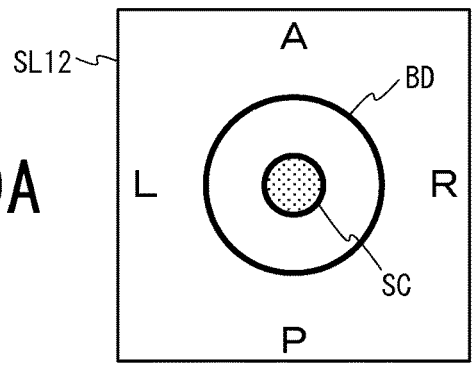
FIG. 9A to FIG. 9D are diagrams illustrating each slice image displayed in accordance with the setting of the unified observational direction in the first embodiment.
Figure 9B:
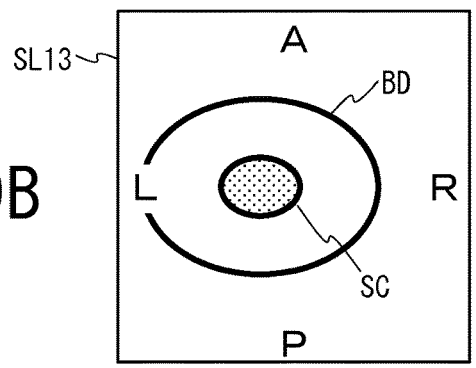
Figure 9C:
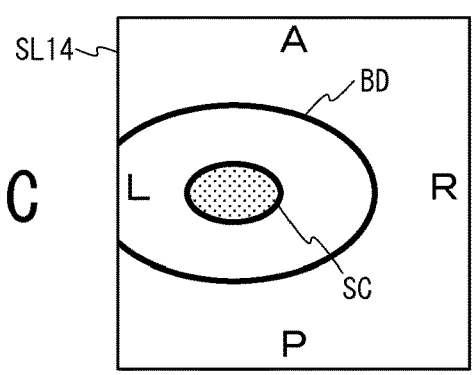
Figure 9D:
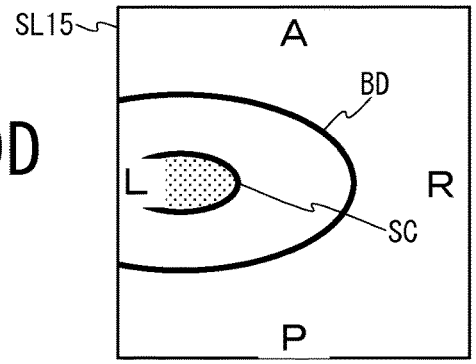
Figure 10A:
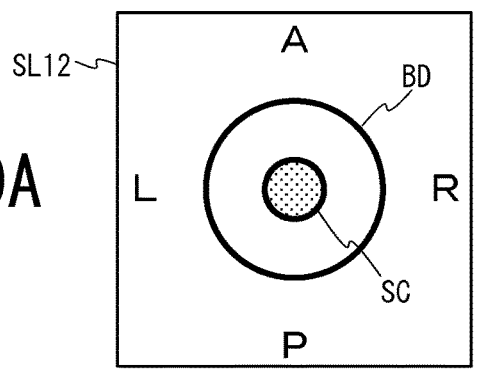
FIG. 10A to FIG. 10D are diagrams illustrating each slice image displayed in accordance with the designated target region and the setting of the unified observational direction in the modified version of the first embodiment.
Figure 10B:
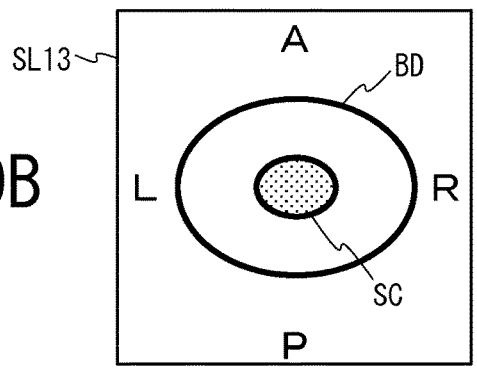
Figure 10C:
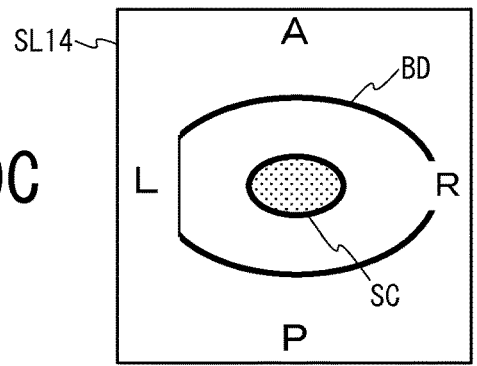
Figure 10D:
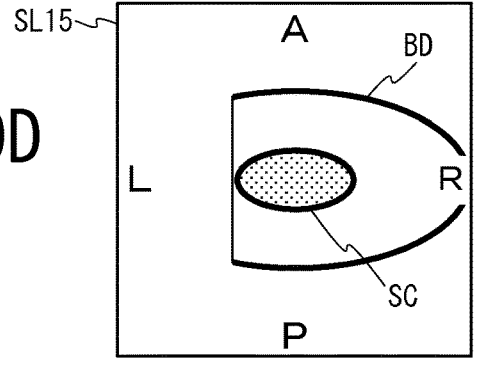

FIG. 8 is a diagram showing an example of a method of setting a unified observational direction in the first embodiment. In FIG. 8, a coronal cross-sectional image of the same human model as illustrated in FIG. 6C is displayed on the display device 74 as a scout image and FIG. 8 further shows that the positions of the respective imaging cross-sections of the same multi-angle imaging as illustrated in FIG. 6C are set as the slices SL10 to SL16. As an example here, the display device 74 displays the position of each slice of the main scan selected like FIG. 6C as guide information for designating and fixing a unified observational direction (observational reference). The unified observational direction is set in this display. Here, to set a unified observational direction (observational reference) means to set and fix the relationship between (a) the display direction of each image and (b) the right-to-left direction, the front-back direction and the head-to-foot direction of a patient, in a unified manner regardless of the direction of each of the slices. Specifically, one direction is selectively set out of the three directions: (a) the direction of the axial type display, (b) the direction of the sagittal type display and (c) the direction of the coronal type display. More specifically, when unifying the observational direction into the direction of the axial type display, the Z axis direction (head-to-foot direction) of the patient coordinate system is set (i.e., selected). When unifying the observational direction into the direction of the sagittal type display, the X axis direction of the patient coordinate system is set. Further, when unifying the observational direction into the direction of the coronal type display, the Y axis direction of the patient coordinate system is set.

Under such a setting method, for example, the display aspect can be consistently fixed to the axial type display regardless of whether the slice direction is above or below the above-mentioned 45 degrees line, by setting the unified observational direction to the Z axis direction (head-to-foot direction) of the patient coordinate system.

Although the unified observational direction may be selected by a user via the input device 72 before execution of the main scan, the unified observational direction may be set after execution of the main scan.

The determining unit 66 may determine the most common cross-sectional direction out of the cross-sectional directions of all the slices of the main scan, and then inputs the determination result into the display device 74 to make the display device 74 distinguishably display the slice, which is determined as the most common cross-sectional direction, as the guide information. As to this distinguishable display, the display device 74 may blink the slice determined as the most common cross-sectional direction, or display it with a chromatic color different from its surrounding areas. In the example of FIG. 8, the slices SL10 and SL11, which are indicated with hatchings, are axial cross-sections as the most common cross-sectional direction, and are distinguishably displayed.

Incidentally, the determining unit 66 may determine an average cross-sectional direction instead of the most common cross-sectional direction and make the display device 74 display the average cross-sectional direction.

By setting the most common cross-sectional direction or the average cross-sectional direction as the unified observational direction, it becomes easier to observe the plural cross sections.

When determining the average cross-sectional direction, the determining unit 66 acquires setting related to the posture of the object P on the table 22 and determines each basic axis direction of the patient coordinate system on the basis of the setting. Next, the determining unit 66 calculates, for each cross-section, the inclination angle θx between its normal line and the X axis of the patient coordinate system, the inclination angle θy between its normal line and the Y axis of the patient coordinate system and the inclination angle θz between its normal line and the Z axis of the patient coordinate system. Afterward, the determining unit 66 calculates the average normal line by using the average value of θx, the average value of θy, and the average value of θz, and then determines the plane orthogonal to the average normal line as the average cross-sectional direction.

In addition, the input device 72 may perform input restriction when the input device sets the unified observational direction. Specifically, the input device 72 displays the X axis, Y axis and Z axis of the patient coordinate system, for example, on the corner of the screen of the display device 74 (the upper right side in the example of FIG. 8), as candidates for the unified observational direction.

A user can select one of the X axis, Y axis and Z axis of the patient coordinate system as the unified observational direction by, for example, keyboard input and cursor operation of a mouse. In other words, input restriction is performed by the input device 72 so that only one direction selected among the X axis, Y axis and Z axis of the patient coordinate system is set as the unified observational direction.

After one of the X axis, Y axis and Z axis of the patient coordinate system is selected as the result of the determination by the determining unit 66, an arrow indicating the direction of the selected axis is automatically superimposed and displayed on each of the slices of the screen of the display device 74. In the example of FIG. 8, the Z axis of the patient coordinate system is selected and the arrow corresponding to the Z axis direction is superimposed and displayed on each of the slices.

However, methods of setting the unified observational direction are not limited to the above aspect. For example, the MRI apparatus 10 may be configured so that any desired direction, not limited to the X, Y, and Z axis, can be set as the unified observational direction. In this case, a user can designate an arbitrary straight line as the unified observational direction by, for example, cursor operation. When an arbitrary straight line is inputted via the input device 72, the display device 74 superimposes and displays the arrow whose direction is the same as the inputted arbitrary straight line on each slice. Incidentally, such an operation mode that the unified observational direction is manually set by a user is referred to as the "observational reference manual selection mode".

By contrast, such an operation mode that the determining unit 66 determines the most common cross-sectional direction or the average cross-sectional direction and sets the determined cross-sectional direction as the unified observational direction is referred to as "the observational reference automatic selection mode".

FIG. 9A to 9D are diagrams illustrating each slice image displayed in accordance with the above-mentioned setting of the unified observational direction. In the example of FIG. 9A to FIG. 9D, the Z axis is selected as the unified observational direction and all the slice images from the slice SL12 to the slice SL15 are displayed under the axial type display as the result.

As it is obvious by comparing FIG. 9A to FIG. 9D with the example of the conventional display method shown in FIG. 7A to FIG. 7D, the slice SL15 above the 45 degrees line (FIG. 9D) is also displayed not under the sagittal type display but under the axial type display. As a result, the anterior side (A), the posterior side (P), the left side (L) and the right side (R) of a patient are respectively displayed as the upper side, the lower side, the left side and the right side of an image in a unified manner through all the images, and this makes it easier for a diagnostic reading doctor etc. to observe the images.

Incidentally, when the unified observational direction is set to the X axis direction or the Y axis direction of the patient coordinate system, the observational direction never changes through the image display of the slices SL10 to SL16 similar to FIG. 9A to FIG. 9D. In addition, characters indicating the orientation of the anterior side, the posterior side, the left side, the right side, the head side or the foot side (such as A, P, L, R, H and F) as accompanying information never change throughout all images.

Display image data corresponding to each of the above displayed images, whose observational directions are unified, are generated by the display image generating unit 67. Then, the display device 74 displays each image on the basis of the generated display image data.

Modified Version of the First Embodiment

In addition to the first embodiment, the target region of a patient can be displayed so as to be located at the same position (for example, the center of a screen) through the respective slice images.

For example, in the display of FIG. 8 for designating the position and direction of each slice of the main scan on the scout image, a target region is set for each slice. A user can set a target region by, for example, using a mouse etc. of the input device 72.

For example, when a target region is the spinal column SC, the position corresponding to the spinal column SC on each slice shown in FIG. 8 is designated by the user. The designated positions are, for example, displayed with black circles etc. as shown in FIG. 8.

FIG. 10A to FIG. 10D are diagrams showing an example of display of the modified version of the first embodiment. As mentioned above, if the spinal column SC is designated as the target region in each slice, the spinal column SC is displayed at the same position (for example, the center of the screen) between the respective slice images.

As a result, when a diagnostic doctor etc. observes the respective slice images in order, observation of images becomes much easier because the position of the target region is further unified in addition to that the observational direction is unified.

Figure 11:
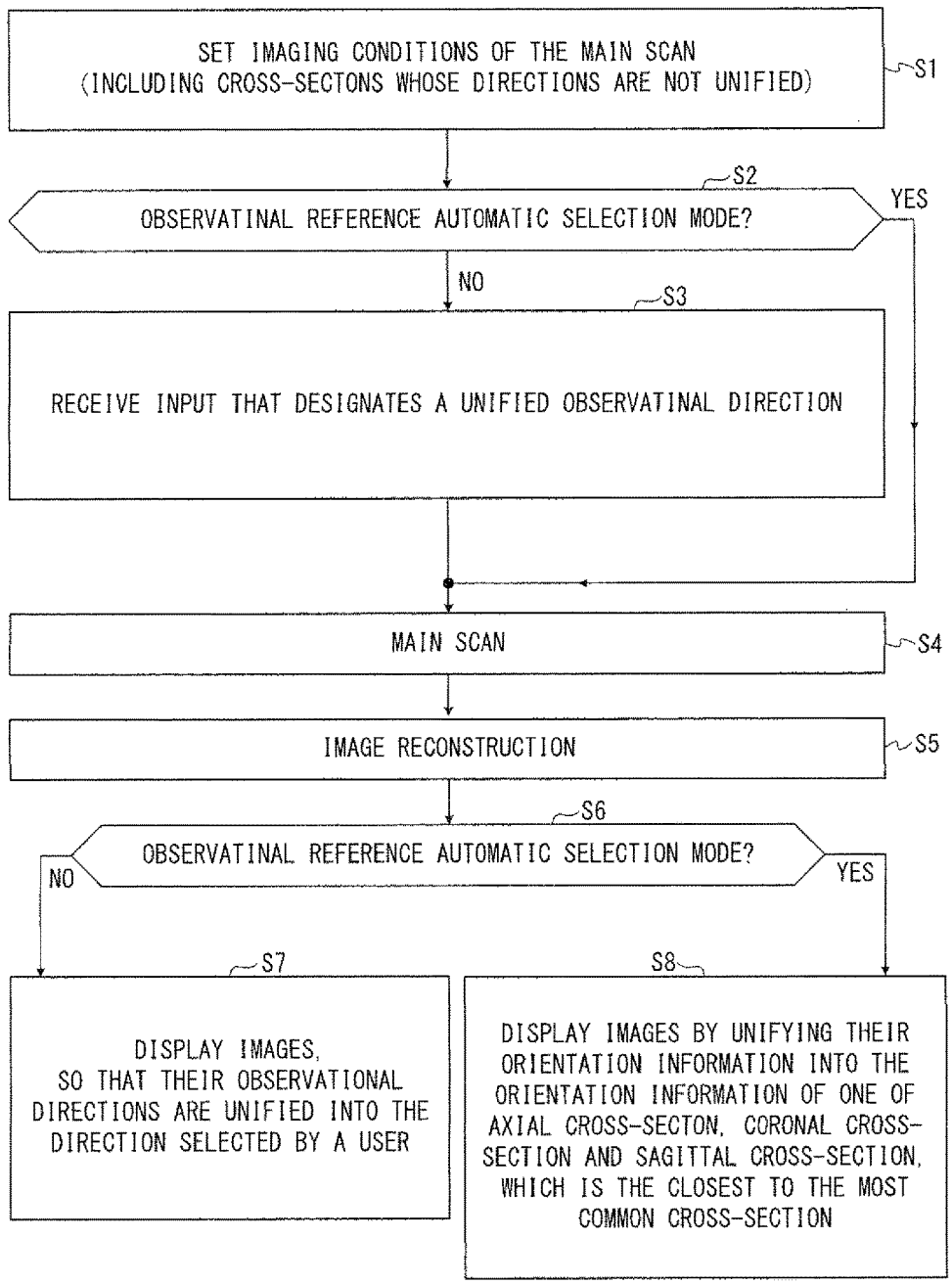
FIG. 11 is a flowchart illustrating an example of a flow of an operation performed by the MRI apparatus of the first embodiment and its modified embodiment.

FIG. 11 is a flowchart illustrating an example of a flow of an operation performed by the MRI apparatus 10 of the first embodiment and its modified embodiment. In the following, according to the step numbers in the flowchart shown in FIG. 11, an operation of the MRI apparatus 10 will be described by referring to the above-mentioned FIG. 1 to FIG. 10 as required.

[Step S1] For example, the scout images of the same object P imaged before the Step S1 are displayed on the display device 74 (FIG. 1), a user sets the imaging regions and so on of the main scan via the input device 72 (FIG. 2 to FIG. 4).

The system control unit 61 sets the imaging conditions of the main scan on the basis of some imaging conditions inputted to the input device 72 such as the imaging regions. As an example here, it is assumed that all the slices to be imaged in the main scan are not unified in terms of their cross-sectional directions. After this, the processing proceeds to the Step S2.

[Step S2] The MRI apparatus 10 selectably provides (a) "the observational reference manual selection mode" in which a user selects the unified observational direction by input as explained in FIG. 8 and (b) "the observational reference automatic selection mode" in which the determining unit 66 and the display device 74 automatically select the unified observational direction.

When a user selects "the observational reference manual selection mode" via the input device 72, the processing proceeds to the Step S3.

On the other hand, when a user selects "the observational reference automatic selection mode", the processing proceeds to the Step S4 after the unified observational direction is automatically selected by the determining unit 66. In this case, the determining unit 66 determines the above-mentioned most common cross-sectional direction, and determines which of an axial cross-section, a coronal cross-section, and a sagittal cross-section is the closest to the most common cross-sectional direction. The determining unit 66 determines the normal line of the cross-section, which is closest to the most common cross-sectional direction out of these three orthogonal cross-sections, as the unified observational direction. Then, the determining unit 66 inputs the determined unified observational direction into the display device 74. Incidentally, the determining unit 66 may determine the above-mentioned average cross-sectional direction, and determine the normal line of the cross-section, which is closest to the average cross-sectional direction out of these three orthogonal cross-sections.

[Step S3] The display device 74 displays (superimposes) the position of each slice of the main scan on the scout image imaged before the Step S1 and performs the guide display for selecting the unified observational direction such as the most common cross-sectional direction (FIG. 8), for example. In addition, the input device 72 receives an input for selecting the unified observational direction. In addition, in the case of the modified version of the first embodiment, the target region is designated for each slice. After this, the processing proceeds to the Step S4.

[Step S4] The system control unit 61 finally determines the pulse sequence of the main scan based on the determined imaging conditions before the Step S4. Afterward, data acquisition of the main scan is performed in accordance with the determined imaging conditions. Specifically, the object P has been already loaded on the table 22 in a predetermined posture. In addition, the shim coil power supply 44 supplies the shim coil unit 32 with electric currents and thereby the static magnetic field formed in the imaging space is uniformed.

Then, as soon as a command to start imaging is inputted from the input device 72 into the system control unit 61, the system control unit 61 inputs the imaging conditions including a pulse sequence etc. into the sequence controller 58. Afterward, the sequence controller 58 drives the gradient magnetic field power supply 46, the RF transmitter 48 and the RF receiver 50 in accordance with the inputted pulse sequence, thereby a gradient magnetic field is formed in the imaging region including the imaging part of the object P, and RF pulses are generated from the RF coil unit 34.

Therefore, MR signals generated by nuclear magnetic resonance inside the object P are detected by the RF coil device 100 (and/or the whole body coil), and the detected MR signals are transmitted from the RF coil device 100 to the RF receiver 50.

The RF receiver 50 performs the above-mentioned predetermined signal processing on the inputted MR signals so as to generate the raw data of MR signals, and inputs these raw data into the image reconstruction unit 62.

The image reconstruction unit 62 arranges and stores the raw data of MR signals as k-space data. The image reconstruction unit 62 reconstructs image data by performing image reconstruction processing including Fourier transformation on the k-space data, and stores the reconstructed image data in the storage device 76.

After this, the processing proceeds to the Step S5.

[Step S5] The image processing unit 64 obtains the image data from the storage device 76, performs predetermined image processing on the obtained image data, and stores the image data subjected to the image processing in the storage device 76.

After this, the processing proceeds to the Step S6.

[Step S6] When "the observational reference manual selection mode" is selected in the Step S2, the processing proceeds to the Step S7. When "the observational reference automatic selection mode" is selected in the Step S2, the processing proceeds to the Step S8.

[Step S7] The display image generating unit 67 acquires image data of all the slices imaged in the main scan from the storage device 76. The display image generating unit 67 generates such display image data that a plurality of images are displayed as images observed from a unified observational direction, from the reconstructed image data, even if a cross-sectional direction of each image changes between these images. This is achieved by, for example, unifying the observational direction of each image into the observational direction selected by a user in the Step S3 before execution of the main scan. More specifically, the display image generating unit 67 generates display image data whose images are unified in terms of the observational direction, in such a manner that all the slice images are displayed under the axial type display as shown in FIG. 9A to FIG. 9D, for example. In addition, in the case of the modified version of the first embodiment, the display image generating unit 67 generates such display image data that the target region of each image is displayed at the same position of the screen in addition to the unification of observational direction, as shown in FIG. 10A to FIG. 10D. The display device 74 displays images observed from the unified observational direction on the basis of the generated display image data.

[Step S8] The display image generating unit 67 acquires image data of all the slices imaged in the main scan from the storage device 76. The display image generating unit 67 generates the display image data whose images are unified into the observational direction automatically selected by the determining unit 66. In other words, the display image generating unit 67 generates such image data that a plurality of images are displayed as images observed from a unified observational direction from the reconstructed image data, even if a cross-sectional direction of each image varies between these images. The processing of the Step S8 is the same as the Step S7 except the difference as to whether the unified observational direction is automatically set or manually set.

Incidentally, in "the observational reference automatic selection mode", automatic setting of the unified observational direction by the determining unit 66 may be performed not in the Step S2 before the execution of the main scan but in the Step S8 after the execution of the main scan. The foregoing is the explanation of the operation of the MRI apparatus 10 of the first embodiment and its modified embodiment.

In the above-mentioned first embodiment and its modified embodiment, a unified observational direction is manually or automatically set before the execution of the main scan for imaging a plurality of images whose cross-sectional directions are irregular (not unified). In other words, the display aspect is unified into one of the axial type display, the sagittal type display and the coronal type display. Thus, when each cross-sectional direction varies between plural images of MRI, the problem of the conventional display method is resolved. Accordingly, it is easy to sequentially observe a plurality of images even if the cross-sectional direction of each image is different between these displayed images. As a result, it becomes easier to visually recognize change of the object P between these images than the conventional technology.

In addition, because the most common cross-sectional direction is displayed as the guide information in the observational reference manual selection mode, a user can select the unified observational direction with reference to the displayed guide information.

Moreover, out of the normal line of an axial cross-section, the normal line of sagittal cross-section, and the normal line of a coronal cross-section, the normal line which is the closest to the normal line of the most common cross-sectional direction is automatically set as the unified observational direction in the observational reference automatic selection mode. Thus, operational burden on a user is reduced.

As just described, according to the first embodiment and its modified embodiment, it is achieved to visually recognize the difference or the abnormality of a region of interest of a patient between plural images more easily than conventional technology.

Incidentally, the MRI apparatus 10 may be configured so that a user can select either the conventional display method (for example, the display method of switching between the axial type display and the sagittal type display with the 45 degrees line on a coronal image as a boundary), the method of the above-mentioned first embodiment, or the method of the above-mentioned modified version of the first embodiment.

The Second Embodiment

In the conventional technology, generated images are displayed in such a manner that the center of each generated image is positioned at the center of a screen, regardless of the position of the region of interest in the generated image. Therefore, in the conventional technology, the display position of the region of interest on the screen is changed for each generated image. Then, the MRI apparatus 10 of the second embodiment operates in "a specific tissue tracking mode". In this case, the extraction processing unit 65 extracts and tracks the cross-section of the specific tissue by performing image analysis, and the display device 74 appropriately shifts each generated image so as to display the specific tissue at the center of the monitor through all the generated images.

As an example here, the display device 74 stereoscopically displays the scout image in order to assist a user in selecting the specific tissue. Specifically, the display device 74 includes a naked-eye stereoscopic display device in which light emitting directions are spatially separated for the respective parallax images, and the display image generating unit 67 generates a plurality of parallax images on the basis of the volume data of the scout image. Thereby, the display device 74 performs three-dimensional display by making mutually different parallax images separately incident on the right and left eyes of a viewer (for example, see Japanese Patent Application Laid-open (KOKAI) Publication No. 2007-94022).

Figure 12:
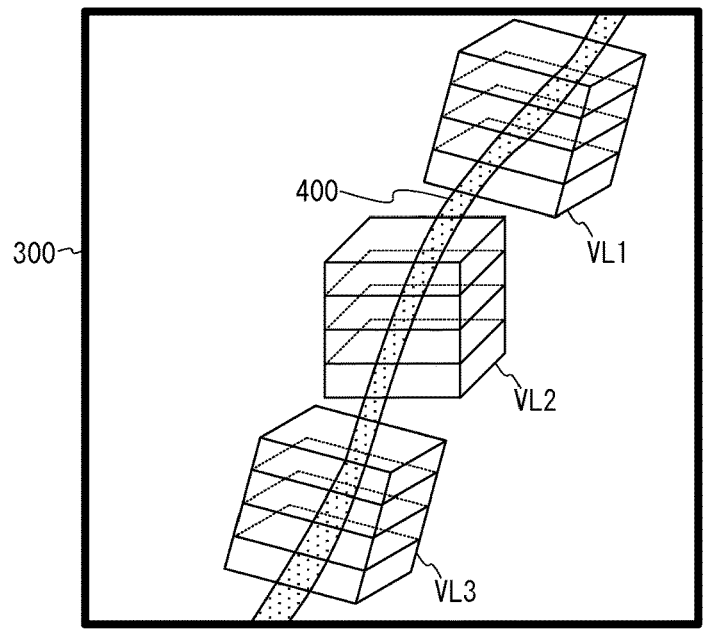
FIG. 12 is a schematic diagram showing an example of setting the imaging region of the main scan on the scout image in the second embodiment.

FIG. 12 is a schematic diagram showing an example of setting the imaging region of the main scan on the scout image in the second embodiment. As an example in FIG. 12, a specific tissue 400 (for example, an intestine and blood vessels) of the object P is included in the scout image 300 to be three-dimensionally displayed in the display device 74. A user can select the slabs VL1, VL2 and VL3 to be imaged in the main scan along the region of interest (the specific tissue 400) in the scout image 300 via the input device 72.

Figure 13:
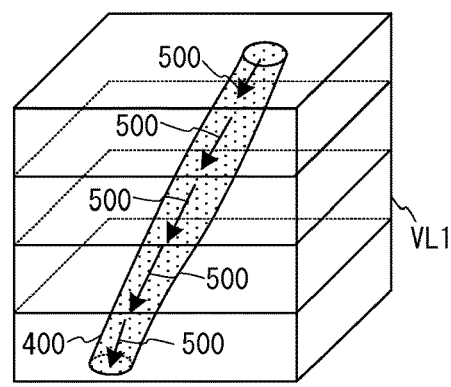
FIG. 13 is a schematic diagram showing an example of designating a specific tissue to be tracked in the second embodiment.

FIG. 13 is a schematic diagram showing an example of designating the specific tissue 400 to be tracked in the second embodiment. The display device 74 expands and displays the slab VL1 selected as the imaging region of the main scan, for example.

A user can manually extract this specific tissue 400, for example, by manipulating the mouse of the input device 72 so as to move the cursor 500 displayed on the monitor of the display device 74 along the region of the specific tissue 400 within the slab VL1. A user can manually extract the entirety of this specific tissue 400 by performing the same manipulation on the other slabs VL2 and VL3.

Figure 14:
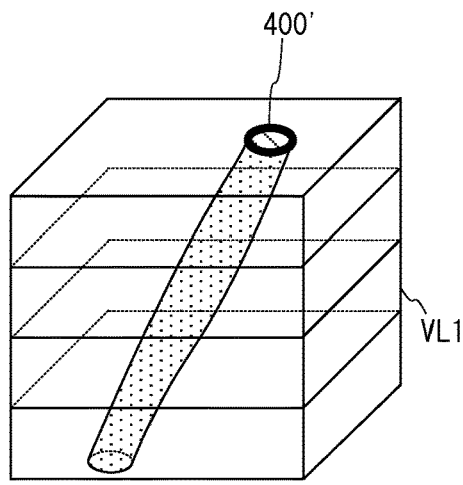
FIG. 14 is a schematic diagram showing another example of designating a specific tissue to be tracked in the second embodiment.

FIG. 14 is a schematic diagram showing another example of designating the specific tissue 400 to be tracked in the second embodiment. Also in this case, the display device 74 expands and displays the slab VL1 selected as the imaging region of the main scan, for example. In the slab VL1, a user can designate only a part 400' of the specific tissue shown with the hatched area in FIG. 14 via the input device 72, for example. In this case, the rest of the specific tissue is automatically extracted by the extraction processing unit 65.

Incidentally, the methods of designating the specific tissue to be tracked are not limited to aspects of FIG. 13 and FIG. 14. For example, consider a case where the specific tissue is an internal organ such as the heart etc. In this case, the extraction processing unit 65 may be configured to extract the specific tissue by performing pattern matching analysis on the basis of a standard human model when a user inputs the name of the organ as textual information via he input device 72

Figure 15:
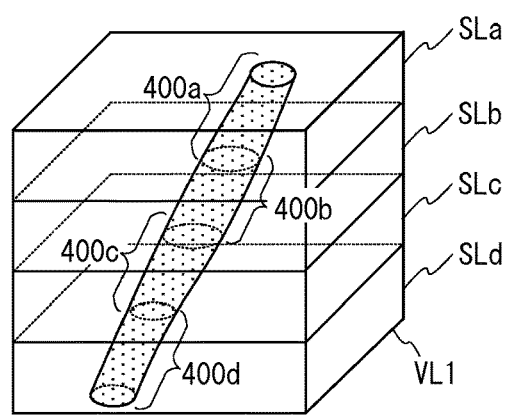
FIG. 15 is a schematic diagram showing an example of a method of tracking the specific tissue performed by the extraction processing unit in the second embodiment.

FIG. 15 is a schematic diagram showing an example of a method of tracking the specific tissue 400 performed by the extraction processing unit 65 in the second embodiment. For the sake of simplifying the explanation in FIG. 15, the volume data of the slab VL1 of the main scan are divided into four slices (SLa, SLb, SLc and SLd).

For example, consider a case where only a part 400' of the specific tissue is designated by a user like FIG. 14. In this case, the extraction processing unit 65 may extract regions 400a, 400b, 400c and 400d, which correspond to the specific tissue 400 in the volume data of the slab VL1 of the main scan, for each slice of the volume data, using the following three parameters, for example.

Firstly, an approximate position of the part 400' of the specific tissue selected by a user on the volume data of the scout image corresponding to the region of the slab VL1 is used.

Secondly, pixel values (luminance levels) of the region of the part 400' of the specific tissue selected by a user on the volume data of the scout image corresponding to the region of the slab VL1 are used.

Thirdly, changing behavior of pixel values of the specific tissue and its adjacent regions in the volume data of the scout image corresponding to the region of the slab VL1 is used.

The extraction processing unit 65 calculates an upper-limit threshold value TH1 and a lower-limit threshold value TH2 of a pixel value as the specific tissue 400 on the basis of the above three parameters, and extracts a continuous region, where every pixel value is within a range from the lower-limit threshold value TH2 to the upper-limit threshold value TH1, as the specific tissue 400, for example.

As to tracking a cross-section the specific tissue 400, the extraction processing unit 65 may determine what tissue of a human body belongs to the specific tissue 400, by performing pattern matching analysis based on a standard human model, and may use the result of the pattern matching analysis. In addition, when an extended line of the specific tissue 400 to be tracked is designated as a whole like FIG. 13, the extraction processing unit 65 extracts the entire region of the specific tissue 400 from all the slabs imaged in the main scan in the way similar to the above.

Figure 16:
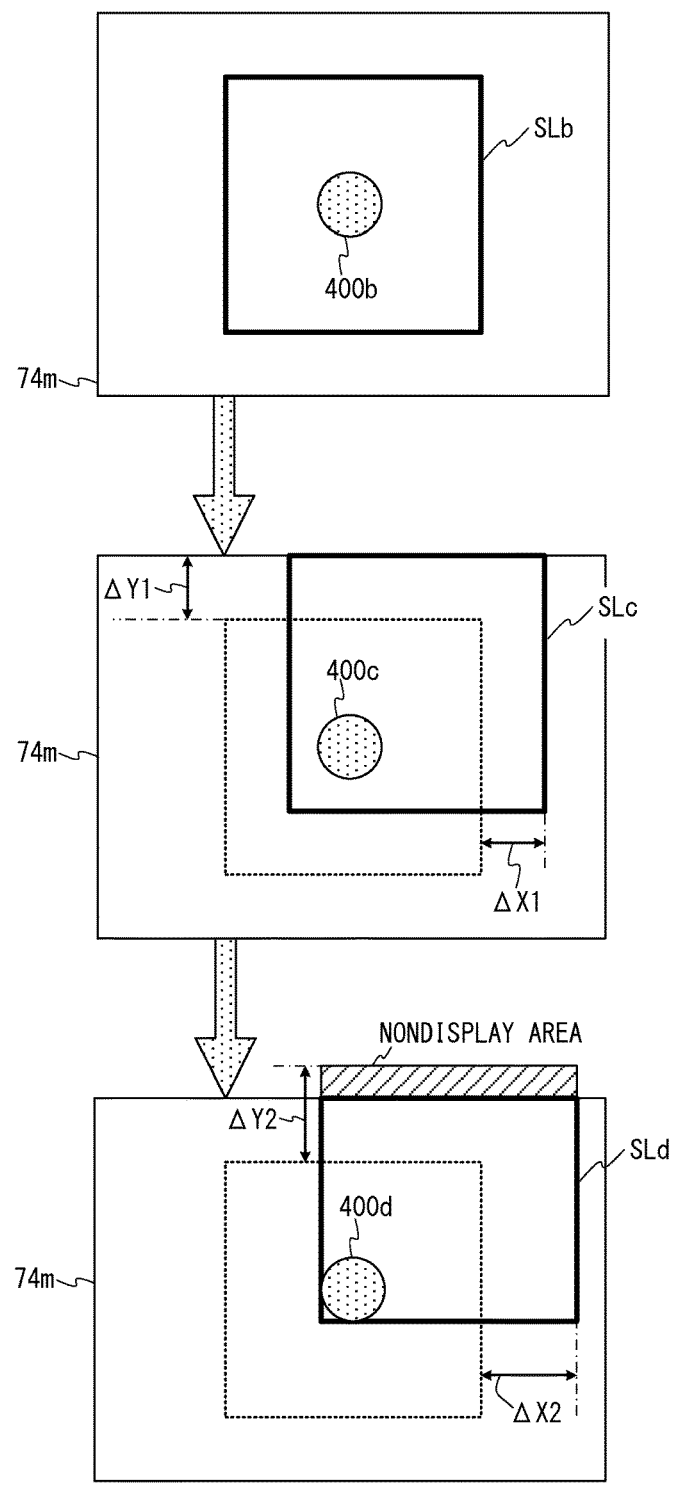
FIG. 16 is a schematic diagram showing an example of display methods of generated images of the main scan with reference to the position of the tracked specific tissue, in the second embodiment.

FIG. 16 is a schematic diagram showing an example of display methods of a generated image of the main scan with reference to the position of the tracked specific tissue, in the second embodiment. As an example in FIG. 16, an example of displaying a part of the volume data of the slab VL1 of the main scan is shown.

The upper part of FIG. 16 corresponds to the second uppermost slice SLb in FIG. 15 including the extracted specific tissue 400b, the middle part of FIG. 16 corresponds to the third uppermost slice SLc in FIG. 15 including the extracted specific tissue 400c, and the bottom part of FIG. 16 corresponds to the fourth uppermost slice SLd in FIG. 15 including the extracted specific tissue 400d.

As shown in FIG. 16, each of the positions of the specific tissues 400c and 400d is shifted from the center of each of the slices (SLc, SLd) to the lower left side. However, the display device 74 shifts the entire image of the slice in an opposite direction such that each of the positions of the specific tissues 400c to 400d is located always at the center of the screen of the display device 74. Because of this shift, a part (hatched region) of the image that extends beyond the upper side of the monitor region 74m is not displayed in the bottom part of FIG. 16.

In the upper part of FIG. 16, the above shift is not performed because the specific tissue 400b is located at the center of the image of the main scan. As compared with a case where the image is displayed so as to locate the center of the image at the center of the monitor region 74m (which case is indicated by the dotted square), the entire image shifts by ΔX1 in the horizontal direction and by ΔY1 in the vertical direction in the middle part of FIG. 16, and the entire image shifts by ΔX2 in the horizontal direction and by ΔY2 in the vertical direction in the bottom part of FIG. 16.

Figure 17:
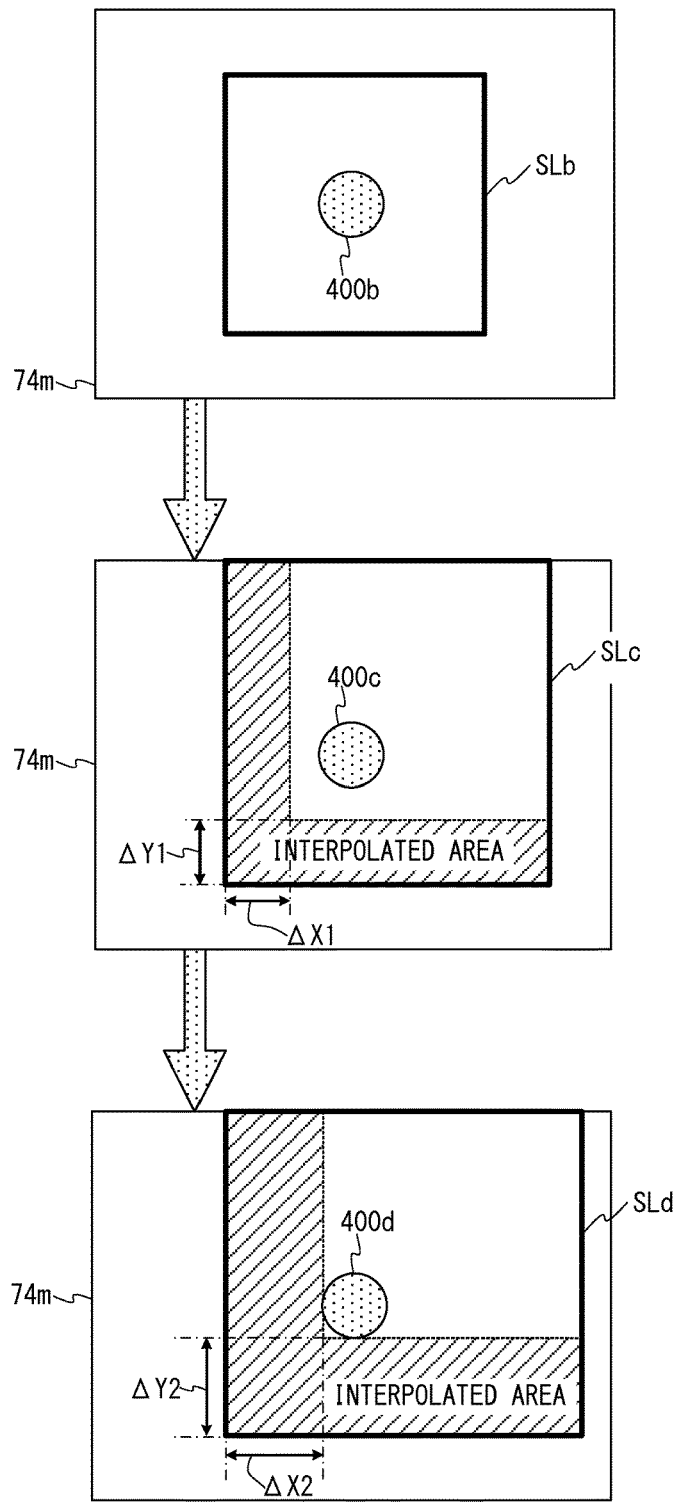
FIG. 17 is a schematic diagram showing another example of display methods of generated images of the main scan with reference to the position of the tracked specific tissue, in the second embodiment.

FIG. 17 is a schematic diagram showing another example of display methods of a generated image of the main scan with reference to the position of the tracked specific tissue, in the second embodiment. The difference between FIG. 17 and FIG. 16 falls only on the point that an image interpolated (expanded) by a shifted amount thereof is displayed. In the middle part and the bottom part of FIG. 17, the hatched regions correspond to the interpolated areas.

The image data used for interpolating can be obtained from image data which is imaged before the current imaging for the same (identical) object P. The image data used for interpolating may be a scout image etc.

By means of the above mentioned interpolation, the space area after shifting may be filled with the image of the same object P.

Figure 18:
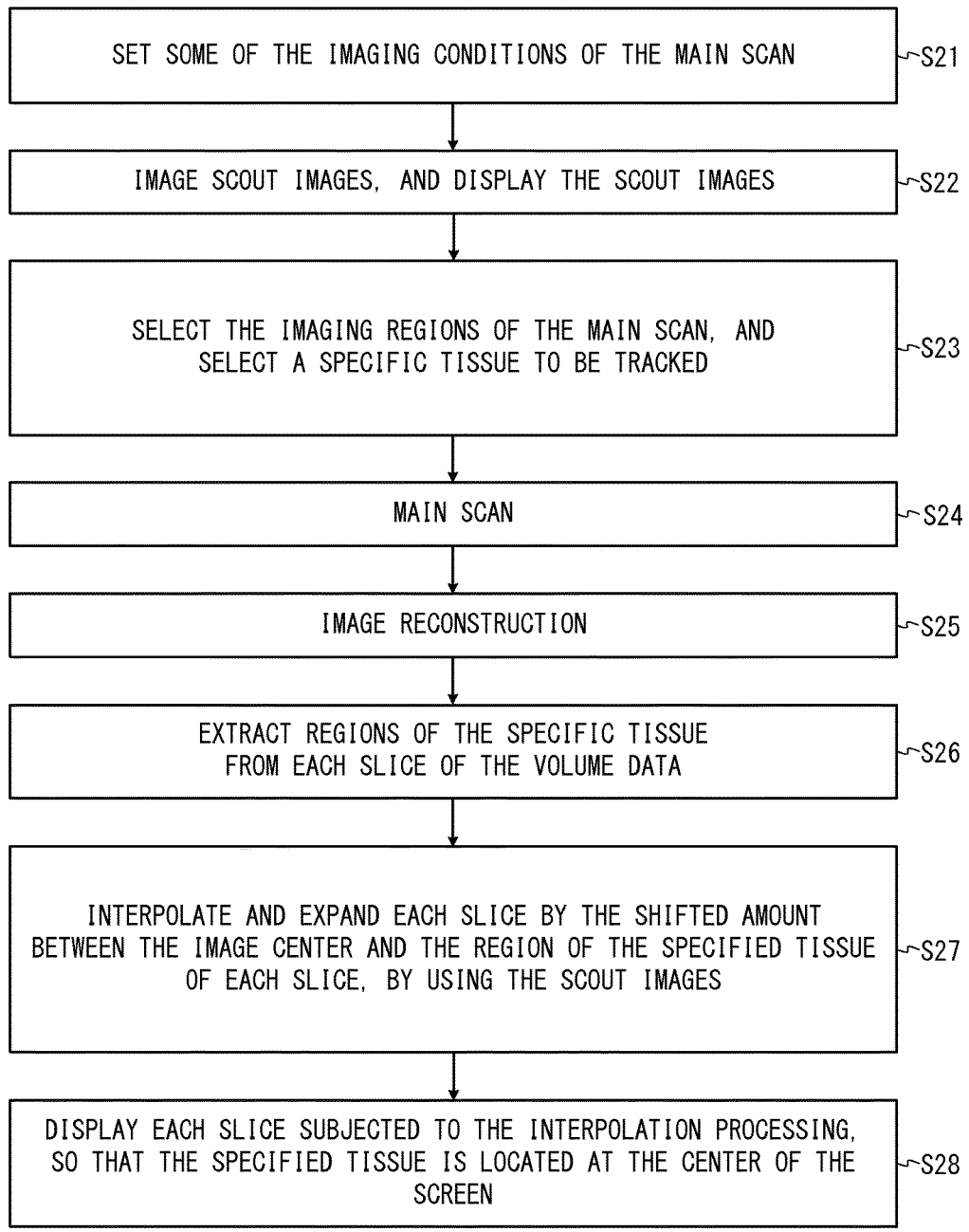
FIG. 18 is a flowchart illustrating an example of a flow of an operation performed by the MRI apparatus of the second embodiment.

FIG. 18 is a flowchart illustrating an example of a flow of an operation performed by the MRI apparatus 10 of the second embodiment. In the following, according to the step numbers in the flowchart shown in FIG. 18, an operation of the MRI apparatus 10 will be described by referring to each of the above-mentioned FIG. 1 to FIG. 18 as required.

[Step S21] A user selects some of the imaging conditions of the main scan via the input device 72 (FIG. 1). The system control unit 61 sets some of the imaging conditions of the main scan on the basis of the conditions inputted to the input device 72 such as a type of a pulse sequence etc.

After this, the processing proceeds to the Step S22.

[Step S22] In order to generate scout images, the system control unit 61 makes each component of the MRI apparatus 10 in the way similar to the Step S4 and the Step S5 of FIG. 11 of the first embodiment. As an example here, it is assumed that the scout image is generated as stereoscopic image data (volume data). The display device 74 acquires the volume data of the scout image from the storage device 76, and three-dimensionally displays the scout image.

After this, the processing proceeds to the Step S23.

[Step S23] As explained in FIG. 12, an input that designates the imaging region of the main scan is given to the input device 72 by a user based on the scout image displayed on the display device 74. The system control unit 61 sets the imaging region of the main scan in accordance with this input information.

Moreover, as explained in FIG. 13 and FIG. 14, an input that designates the specific tissue to be tracked is given to the input device 72 by a user 74. The information of this input is transferred to the extraction processing unit 65.

After this, the processing proceeds to the Step S24.

[Step S24] The system control unit 61 finally determines the pulse sequence of the main scan based on the determined imaging conditions before the Step S24. Then, data acquisition of the main scan is performed on the basis of the determined imaging conditions, in the way similar to the Step S4 of FIG. 11 of the first embodiment, and the k-space data are stored in the storage device 76.

After this, the processing proceeds to the Step S25.

[Step S25] The image reconstruction processing is performed in the way similar to the Step S5 of FIG. 11 of the first embodiment, and volume data (three-dimensional image data) are stored in the storage device 76.

After this, the processing proceeds to the Step S26.

[Step S26] The extraction processing unit 65 extracts the region of the specific tissue 400 from the volume data, as explained in FIG. 15. When only a part 400' of the specific tissue is designated in the Step S23 (see FIG. 14), the extraction processing unit 65 extracts the outer border of the entire specific tissue 400. Meanwhile, when the extending line (or contour) of the entire specific tissue 400 is designated to a certain degree in the Step S23 (FIG. 13), the extraction processing unit 65 extracts the outer border of the entire specific tissue 400 on the basis of the designated range. As to the extraction method, it has been explained above.

The extraction processing unit 65 inputs the extraction result of the specific tissue 400 into the display image generating unit 67.

After this, the processing proceeds to the Step S27.

[Step S27] The display image generating unit 67 calculates the shift direction and the shift amount ($\Delta X1$, $\Delta Y1$, etc. in FIG. 16) in the case of locating the specific tissue 400 at the center of the monitor region 74m in image display, on the basis of the position of the specific tissue 400 in each slice of the volume data. Thereby, the display image generating unit 67 interpolates the region of the object P, which is on the side opposite to the shift direction and is not included in the volume data of the main scan, by using the volume data of the scout image.

The display image generating unit 67 stores the interpolated volume data in the storage device 76. Incidentally, it doesn't matter if the resolution of the interpolated region is lower than the resolution of the other regions (i.e. non-interpolated regions).

After this, the processing proceeds to the Step S28.

[Step S28] The display image generating unit 67 acquires the interpolated volume data of the main scan from the storage device 76. Then, the display image generating unit 67 generates display image data in which each of the entire image indicated by the interpolated volume data is shifted so as to locate the specific tissue 400 at the center of the monitor region 74m (FIG. 17). The display device 74 displays the images whose specific tissues are unified in terms of the display position on the screen, on the basis of the generated display image data.

Incidentally, the processing of image interpolation in the Step S27 may be omitted and each image may be displayed so as to locate the specific tissue 400 at the center of the monitor region like FIG. 16.

In addition, an example in which the specific tissue 400 to be tracked is selected on the basis of the scout image before performing the main scan has been explained in the above flow chart. However, the embodiments of the present invention are not limited to such aspects. The display device 74 may be configured to display the volume data after reconstruction of image data (volume data) of the main scan, and the input device 72 may be configured to receive input for selecting the specific tissue 400 to be tracked. Also in this case, the MRI apparatus 10 may be configured so that the specific tissue 400 to be tracked is manually designated as a whole by a user like FIG. 13. Alternatively, the MRI apparatus 10 may be configured so that only a part 400' of the specific tissue is designated by a user and the rest of the specific tissue is automatically extracted by the extraction processing unit 65.

The foregoing is a description of the operation of the MRI apparatus 10 according to the second embodiment. The difference between the second embodiment and the conventional technology will be explained as follows.

Figure 19:
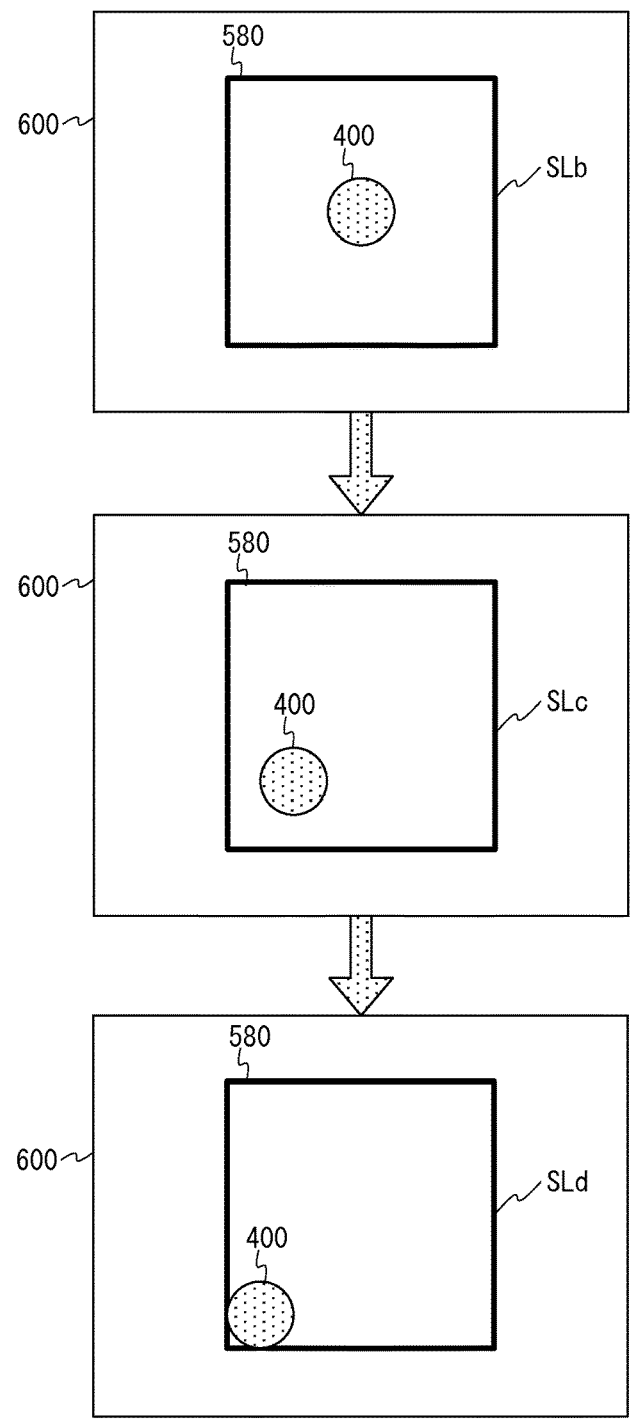
FIG. 19 is a schematic diagram showing the display method of the conventional technology under the assumption that the imaging region of the main scan and the specific tissue to be tracked are the same as the second embodiment.

FIG. 19 is a schematic diagram showing the display method of the conventional technology under the assumption that the imaging region of the main scan and the specific tissue to be tracked are the same as the second embodiment. In FIG. 19, each bold frame is the outer rims 580 of the image, and each hatched region is the area of the specific tissue 400. As shown in FIG. 19, in the conventional display method, because an image is displayed so as to make the center of the image accord with the center of the monitor region 600, the position of the specific tissue 400 (which is region of interest) varies between the images in the monitor region 600 and thus, it is difficult to follow the specific tissue 400.

By contrast, in the second embodiment, because the entire image is shifted so as to consistently locate the specific tissue 400 at the center of the monitor region 74m and is displayed, it is easy for an observer to visually follow the specific tissue 400 which is region of interest on the screen. As a result, in the case of continuously observing a plurality of images, even slight change within the region of interest between these images can be visually recognized more easily than the conventional technology.

Moreover, the object region, which locates on the side opposite to the shift direction and is not included in the volume data of the main scan, is interpolated in accordance with the shift direction and the shift amount in the above image display. Thus, it becomes easier to observe the change of the region of interest in sequential display of a plurality of images.

As described above, according to the second embodiment, even when arrangement of the region of interest changes between plural images of MRI, change within the region of interest between these images can be visually recognized more easily than the conventional technology.

<Supplementary Notes on Embodiments>

[1] In order to simplify the explanation, an example in which "the observational reference automatic selection mode" and "the observational reference manual selection mode" are installed in the MRI apparatus 10 has been explained in the first embodiment, and an example in which "the specific tissue tracking mode" is installed in the MRI apparatus 10 has been explained in the second embodiment. However, the embodiments of the present invention are not limited to such aspects. The MRI apparatus 10 may be configured to be able to select one of these three operation modes.

[2] Correspondences between terms used in the claims and terms used in the embodiment described above will be described. Note that the correspondences described below are just some of possible interpretations for reference and should not be construed as limiting the embodiments of the present invention.

The processing circuitry 60 is an example of the processing circuitry described in the claims.

The (whole body coil of the) RF coil unit 34 and the RF coil device 100 are examples of an RF coil described in the claims.

The input device 72 is an example of the input circuit described in the claims.

The display device 74 is an example of the display described in the claims.

[3] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   an MRI gantry including at least one RF (Radio Frequency) coil and a gradient magnetic field coil, wherein the RF coil receives MR (Magnetic Resonance) signals from an object when an excitation RF signal from the RF coil and a gradient magnetic field from the gradient magnetic field coil are applied to the object;
   processing circuitry configured to
      (a) reconstruct, from the MR signals, plural slice images of the object having different cross-sectional directions, and
      (b) generate display image data from the reconstructed plural slice images such that the display image data represents respectively corresponding plural slice display images all observed from a fixed observation direction; and
   a display configured to display the display images observed from the fixed observation direction.

2. The magnetic resonance imaging apparatus according to claim 1,
   wherein the processing circuitry is configured to selectively perform first generation processing or second generation processing,
   wherein, in the first generation processing, the processing circuitry is configured to determine a display type of a cross-section of each of the plurality of images among three display types of an axial plane display, a sagittal plane display, and a coronal plane display, and apply relationships between (a) a topside-to-downside direction, a right-to-left direction, and a front-back direction of the object and (b) an upper side, a lower side, a right side, and a left side in image display, to the respective plurality of images based on the display type of the of the cross-section of each of the plurality of images, to generate the display image data, and
   wherein, in the second generation processing, the processing circuitry is configure to apply one of the relationships defined to one display type selected among the three display types to all of the images, even if the display types are different among the plurality of the images reconstructed based on the MR signals acquired sequentially.

3. The magnetic resonance imaging apparatus according to claim 1, further comprising an input circuit configured to receive an input determining the fixed observation direction before execution of a diagnostic MRI scan,
   wherein the processing circuitry is configured to generate the display image data based on the input determining the fixed observation direction.

4. The magnetic resonance imaging apparatus according to claim 3, wherein
   the processing circuitry is configured to determine that a cross-sectional direction having a highest frequency of occurrence among the cross-sectional directions of all the plural slices is a most common cross-sectional direction, after the cross-sectional directions of the plurality of images are set as imaging conditions of a diagnostic MRI scan;
   the display is configured to display the most common cross-sectional direction determined by the processing circuitry; and
   the input circuit is configured to receive the input determining the fixed observation direction, while the display is displaying the most common cross-sectional direction.

5. The magnetic resonance imaging apparatus according to claim 4, wherein
   the display is configured to display the plurality of images observed from the fixed observation direction in such a manner that orientation information associated with the fixed observation direction is additionally displayed on each of the plural images, wherein the orientation information indicates at least one of right-left direction, head-foot direction, and anterior-posterior direction of the object.

6. The magnetic resonance imaging apparatus according to claim 1, wherein the processing circuitry is further configured to
   (a) determine a most common cross-sectional direction or an average cross-sectional direction of the plurality of images as the fixed observation direction based on respective cross-sectional directions of the plurality of images, wherein the most common cross-sectional direction is a cross-sectional direction having a highest frequency of occurrence among the cross-sectional directions of all the plural slices, and the average cross-sectional direction is an average of the cross-section directions of all the plural slices, and
   (b) generate the display image data such that the determined most common cross-sectional direction or the determined average cross-sectional direction becomes the fixed observation direction.

7. A magnetic resonance imaging (MRI) apparatus comprising:
   an MRI gantry including at least one RF (Radio Frequency) coil and a gradient magnetic field coil, wherein the RF coil receives MR (Magnetic Resonance) signals from an object when an RF signal from the RF coil and a gradient magnetic field from the magnetic field gradient coil are applied to the object;
   an input circuit configured to receive an input which designates a specified tissue of the object to be tracked between a plurality of images of the object;
   processing circuitry configured to
      (a) reconstruct, from the MR signals, plural slice images of the object having different cross-sectional directions or different cross-sectional positions,
      (b) extract a region of the specified tissue from each of the plurality of slice images, and
      (c) generate display image data from the reconstructed image data such that the extracted region of the specified tissue of each of images will be displayed at a fixed position; and
   a display configured to display images based on the display image data, so that the extracted region of the specified tissue of each of the images is displayed at the fixed position on a screen.

8. The magnetic resonance imaging apparatus according to claim 7, wherein the processing circuitry is further configured to generate the display image data such that the extracted region of the specified tissue of each of the images will be displayed at a center of the screen, by shifting each image as a whole.

9. The magnetic resonance imaging apparatus according to claim 8, wherein
   the processing circuitry is further configured to generate the display image data so that an image is expanded by performing interpolation of a region of the object, which is not included in the reconstructed image data and is located at a side opposite to a shifting direction, based on past image data of a same object, when the image is shifted as a whole to make the extracted region of the specified tissue be displayed at the center of the screen.

10. An image display method carried out using a magnetic resonance imaging (MRI) apparatus, said method comprising:
  receiving MR (Magnetic Resonance) signals from an object;
  reconstructing, from the MR signals, plural slice images of the object having different cross-sectional directions;
  generating display image data from the reconstructed plural slice images such that the display image data represents respectively corresponding plural slice display images all observed from a fixed observation direction; and
  displaying the display images observed from the fixed observation direction.

* * * * *